United States Patent [19]

Tang

[11] Patent Number: 5,635,855

[45] Date of Patent: Jun. 3, 1997

[54] METHOD FOR SIMULTANEOUS PROGRAMMING OF IN-SYSTEM PROGRAMMABLE INTEGRATED CIRCUITS

[75] Inventor: Howard Y. M. Tang, San Jose, Calif.

[73] Assignee: Lattice Semiconductor Corporation, Hillsboro, Oreg.

[21] Appl. No.: 505,837

[22] Filed: Jul. 21, 1995

[51] Int. Cl.⁶ .................................. H03K 19/177
[52] U.S. Cl. ............................ 326/38; 364/489
[58] Field of Search ................ 326/38, 39; 364/491, 364/489, 490

[56] References Cited

U.S. PATENT DOCUMENTS

| | | | |
|---|---|---|---|
| 4,488,246 | 12/1984 | Brice | 364/716 |
| 4,879,688 | 11/1989 | Turner et al. | 365/201 |
| 4,940,909 | 7/1990 | Mulder | 326/38 |
| 5,237,218 | 8/1993 | Josephson et al. | 307/465 |
| 5,256,918 | 10/1993 | Suzuki | 326/38 |
| 5,329,179 | 7/1994 | Tang et al. | 307/465 |
| 5,493,239 | 2/1996 | Zlotnick | 326/38 |
| 5,495,181 | 2/1996 | Kolze | 326/38 |

OTHER PUBLICATIONS

ISP Manual 1994 "Lattice In-System Programmability Manual 1994".

*Primary Examiner*—Edward P. Westin
*Assistant Examiner*—Benjamin D. Driscoll
*Attorney, Agent, or Firm*—Skjerven, Morrill, MacPherson, Franklin & Friel; Edward C. Kwok

[57] ABSTRACT

Multiple in-system programmable devices are connected in series to a programming controller for simultaneous programming. One embodiment puts all such in-system programmable devices in programming mode, and to receive programming data and programming instruction simultaneously. In that configuration, all devices begins programming and stops programming simultaneously.

10 Claims, 24 Drawing Sheets

22V10   PV   22V10.jed
1016    PV   1016.jed
1032    PV   1032.jed

```
*
QF5892*
G0*
F0*
N And Array Rows*
L00000      ROW ADDRESS 0                                      ROW ADDRESS 43
```

BIT 0

```
1 1111111111111110111111111111111111111111 1
1 1111111111111111111111111111111111111111 1
1 1011110111011101110111011111111111111111 1
1 1101110111011101110111011111111111111111 1
1 1101110111110111011101110111111111111111 1
1 1101110111011101110111011101111111111111 1
1 1101110111011011101110111011111111111111 1
1 1101110111011011011101110111011111111111 1
1 1101110111011011101110111011111111111111 1
1 1011101110111011011101110111111111111111 1
0 0000000000000000000000000000000000000000 0
1 1111111111111111111111111111111111111111 1
1 1011101110111011101110111011111111111111 1
      . . . . . . . . . . . . . . . .
      . . . . . . . . . . . . . . . .
0 0000000000000000000000000000000000000000 0
0 0000000000000000000000000000000000000000 0
0 0000000000000000000000000000000000000000 0
0 0000000000000000000000000000000000000000 *
N Architecture Row*
```

}—601

BIT 131

```
L5808
101010101010100000*
N UES Row*
L5828
000000010010001101000101011001111000100 10000
101010111100110 11110*
CFBD8*
AF2C
```

FIG. 8d ispGAL Programming State Machine Instruction Set

| Instruction | Operation | Description |
|---|---|---|
| 00000 | NOP | No Operation Performed. |
| 00010 | SHIFT_DATA | Clocks Data Into, Or Out Of, The Data Shift Register. |
| 00011 | BULK_ERASE | Erases The Entire Device. |
| 00111 | PROGRAM | Programs The Serial Shift Register Data Into The Addressed Row. |
| 01010 | VERIFY | Load Data From The Selected Row Into The Serial Shift Register. |
| 01110 | FLOWTHRU (PASS) | Disables The Shift Register (SDI=SDO). |
| 10100 | ARCH SHIFT | Enables The Architecture Shift Register For Shifting Data Into Or Out Of The Register. |

FIG. 10c ispLSI Programming State Machine Instruction Set

| Instruction | Operation | Description |
|---|---|---|
| 00000 | NOP | No Operation Performed. |
| 00001 | ADDSHIFT | Address Register Shift: Shifts Address Into The Address Shift Register From SDIN. |
| 00010 | DATASHIFT | Data Register Shift: Shifts Data Into Or Out Of The Data Serial Shift Register. |
| 00011 | UBE | User Bulk Erase: Erase The Entire Device. |
| 00111 | PRGMH | Program High Order Bits: The Data In The Data Shift Register is Programmed Into The Addressed Row's High Order Bits. |
| 01000 | PRGML | Program Low Order Bits: The Data In The Data Shift Register is Programmed Into The Addressed Row's Low Order Bits. |
| 01001 | PRGMSC | Program Security Cell: Programs The Security Cell Of The Device. |
| 01010 | VER/LDH | Verify/Load High Order Bits: Load The Data From The Selected Row's High Order Bits Into The Data Shift Register For Verification. |
| 01011 | VER/LDL | Verify/Load Low Order Bits: Load The Data From The Selected Row's Low Order Bits Into The Data Shift Register For Verification. |
| 01110 | FLOWTHRU (PASS) | Flow Through: Bypasses All The Internal Shift Registers And SDOUT Becomes The Same As SDIN. |

FIG. 10d

METHOD FOR SIMULTANEOUS PROGRAMMING OF IN-SYSTEM PROGRAMMABLE INTEGRATED CIRCUITS

BACKGROUND OF THE INVENTION

1. Field of the Invention

This invention relates to programmable integrated circuits, and in particular, the present invention relates to techniques for programming multiple programmable devices simultaneously.

2. Discussion of the Related Art

Programmable devices that can be programmed and reprogrammed without being removed from its application environment are widely preferred because programming and reprogramming of such devices can be performed with ease. One type of such devices is the "In-system programmable logic devices" or "ISP PLDs", available from Lattice Semiconductor Corporation. (To simplify reference, in the following description, such and similar devices are all referred to as "ISP PLDs". It should be understood, however, that the teachings in the following description are applicable to all types of field programmable devices, including programmable logic devices, programmable memories, and programmable analog circuits). The design and use of ISP PLDs are disclosed in the prior art, e.g. (i) U.S. Pat. No. 5,329,179 entitled "Arrangement For Parallel Programming Of In-system Programmable IC Logical Devices", to Tang et al, filed on Oct. 5, 1992 and issued on Jul. 12, 1994. (ii) U.S. Pat. No. 5,237,218, entitled "Structure and Method for Multiplexing Pins for In-system Programming", to G. Josephson et al, filed on May 3, 1991 and issued on Aug. 13, 1993; (iii) U.S. Pat. No. 4,879,688, entitled "In-system Programmable Logic Devices" to Turner et al, filed on May 13, 1986, issued on Nov. 7, 1989; and (iv) U.S. Pat. No. 4,855,954, entitled "In-system Programmable Logic Device with Four Dedicated Terminals" to Turner et al, filed on Oct. 25, 1988, and issued on Aug. 8, 1989.

In the prior art, each ISP PLD in a system board containing multiple ISP PLDs is individually and sequentially programmed. To program multiple ISP PLDs simultaneously requires both additional hardware and special configurations of the ISP PLDs. For example, where simultaneous programming of multiple ISP PLDs is possible, additional circuits for signal multiplexing are typically required. When devices in an application are programmed individually and sequentially, the devices to be programmed are chained serially and hence the total programming time of the serial chain of devices is the sum of the times required to program each device individually.

An ISP PLD contains a large number of programmable logic components, e.g. the "min-terms" of a programmable gate array. In some ISP PLDs, a linear address space is provided, and the programmable logic components of an ISP PLD are programmed in ascending address order until all the programmable logic components of the entire ISP PLD are programmed. Thus, even when simultaneous programming is provided, the total programming time of a system board is often determined by the sum of the time required to program that ISP PLD on the system board which has the most number of programmable components, and the time required to send data to all the ISP PLDs of the serial chain.

In the prior art, a "programming command generator" is given a data file which contains only the pattern necessary to program the ISP PLDs on a given system board. The programming command generator derives from the data file all the device dependent parameters, and provides the commands for the programming to occur.

SUMMARY OF THE INVENTION

In accordance with the present invention, a method for programming, simultaneously, multiple field programmable integrated circuits or devices is provided. According to the present invention, such method includes the steps of: (i) connecting field programmable devices serially in a chain configuration; (ii) constructing a data stream file which contains a data stream for programming the field programmable devices simultaneously, such that the programmable devices are simultaneously scheduled under the data stream (a) to receive instructions, (b) to shift programming data into the field programmable devices, (c) to execute instructions and (d) to shift data out of the field programmable devices; (iii) retrieving from each of a number of program data files, for each of the field programming devices, an individual programming data stream; (iv) filling the data stream file with programming data from each of the individual programming data streams thus retrieved; and (v) programming the field programmable devices simultaneously using the data stream file thus composed.

In accordance with a further aspect of the present invention, the individual programming data stream includes programming instructions and programming data. Under this further aspect, programming data are sorted such that rows having a predetermined data pattern (e.g. all '1's) are placed behind rows not having the predetermined data pattern. In one embodiment, the predetermined data pattern corresponds to a default data pattern of the field programmable device when it is unprogrammed. In accordance with the present invention, programming for such rows can be omitted.

The present invention achieves the advantage of programming simultaneously the devices in a serially connected chain of field programmable devices, thereby minimizing total programming time. The present invention achieves such advantage using conventional programming hardware without requiring additional circuitry.

In accordance with one aspect of the present invention, the devices programmed by the method of the present invention are not necessarily programmed in ascending or descending address order. By grouping programming data units (e.g. rows) in accordance to whether a predetermined pattern exists in the programming data in a given programming unit, so as to allowed such programming unit to be omitted, minimum programming time can be realized. In the present invention, substantial savings in programming time can be achieved by omitting programming in such programming unit having such predetermined data pattern.

The present invention further reduces programming time by lining up the addresses of rows which do not require programming.

This invention simplifies the software program portion of a programming command generator by the use of a composite file (ispSTREAM file) which includes the ID stream, the address stream, the instruction stream and the programming data stream. When applying these data streams to multiple ISP PLDs simultaneously, set-up times of the serially connected ISP PLDs are common, thereby achieving substantial savings in programming time.

In accordance with yet another aspect of the present invention, a data file is prepared representing a data stream including programming data bit patterns, programming addresses and programming instructions. Preparation of such a data file simplifies the task for the Programming Command Generator.

The present invention is better understood upon consideration of the detailed description below and accompanying drawings.

BRIEF DESCRIPTION OF THE DRAWINGS

FIG. 6 is a JEDEC file illustrative of the "22V10.jed" file referenced in FIG. 5 for ISP PLD 401.

FIG. 7 is a JEDEC file illustrative of the "1016.jed" file referenced in FIG. 5 for ISP PLD 402.

FIG. 8 is a JEDEC file illustrative of the "1032.jed" file referenced in FIG. 5 for ISP PLD 403.

FIG. 10c shows the instruction set executable by the programming state machine of an ispGAL22V10 type device.

FIG. 10d shows the instruction set executable by the programming state machine of an ispLSI type device.

FIG. 18c shows the contents of 5-bit instruction registers 105, 205 and 305 of ISP PLDs 401–403, respectively, after the programming instructions are downloaded at step 1519.

DETAILED DESCRIPTION OF THE PREFERRED EMBODIMENTS

One embodiment of the present invention, which is described in detail below, is provided by a software program written in the familiar "C" programming language. This software program, which is subject to copyright protection, is provided in source code form in the accompanying Appendix A. While the copyright owner permits anyone to make facsimile copies of this source code, as it appears in the files of the U.S. Patent and Trademark Office in connection with this patent document or patent disclosure, the copyright owner explicitly reserves all other rights with respect to this software program.

The present invention is described herein by reference to two types of ISP PLDs, both available from Lattice Semiconductor Corporation, the Assignee of this Patent Application. The first ISP PLD type is represented by the ispGAL22V10, which includes four programming pins: Mode, SCLK (Serial Clock), SDI (Serial Data In), and SDO (Serial Data Out). The operations of these programming pins are described in the "ISP Manual 1994", available from Lattice Semiconductor Corporation. The ispGAL22V10 device is placed in the programming mode when the Mode signal is asserted, while the signal on the SCLK pin is pulsed. Once in the programming mode, programming operations are controlled by the programmer via signals on the Mode and SDI pins.

The second ISP PLD type is the Lattice ispLSI devices. In the ispLSI devices, an ISP PLD is programmed using five pins, which are designated: ispEN ("in-system programming Enable"), Mode, SCLK, SDI, and SDO. Unlike a ispGAL22V10 type device, an ispLSI type device is placed in the programming mode when the ispEN pin is asserted. Once in the programming mode, programming is controlled by the Mode, SDI and SCLK pins. The structures and operations of ispLSI devices are also fully described in the ISP Manual 1994 referenced above.

Figures 4, 5:
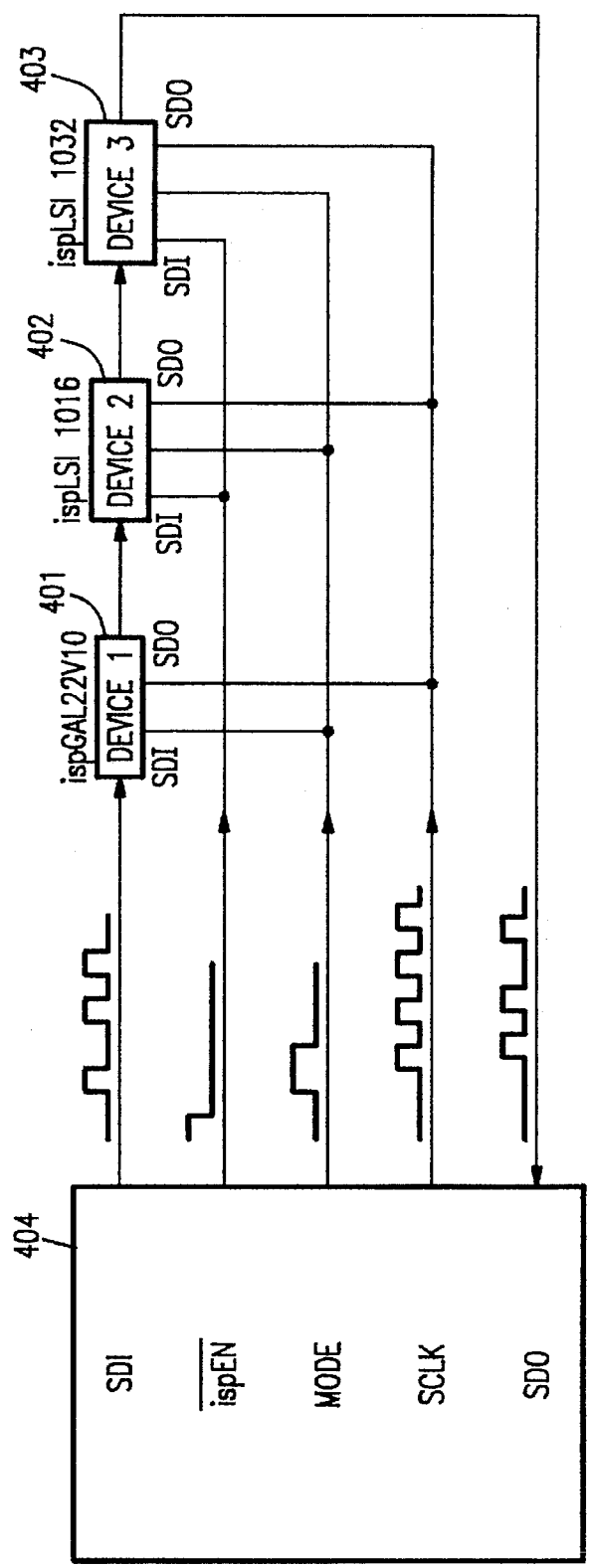
FIG. 4 shows an embodiment of the present invention in which three ISP PLDs 401, 402 and 403 are connected to a programming command generator 404.
FIG. 5 shows a configuration description file 500 for specifying programming of the ISP PLDs 401, 402 and 403 of FIG. 4.

FIG. 4 shows an embodiment of the present invention in which three ISP PLDs 401, 402 and 403 are connected to a programming command generator 404. As shown in FIG. 4, ISP PLD 401, 402 and 403 have their SDI and SDO terminals connected in a serial fashion ("serial chain" 400).

so that serial programming data from programming command generator 404 to ISP PLD 403 can be provided via the SDI and SDO terminals of ISP PLDs 401 and 402. Likewise, serial programming data can be shifted into ISP PLD 402 through the SDI and SDO terminals of ISP PLD 401. This serial connection is known as a "serial chain". In this embodiment, ISP PLD 401 is an ispGAL22V10 device, ISP PLD 402 is an ispLSI type device (specifically, an ispLSI 1016) and ISP PLD 403 is also an ispLSI type device (an ispLSI 1032). The Mode and SCLK pins of ISP PLDs 401, 402 and 403 are commonly connected. In addition, the ispEn pins of ISP PLDs 402 and 403 are commonly connected.

Figure 1:
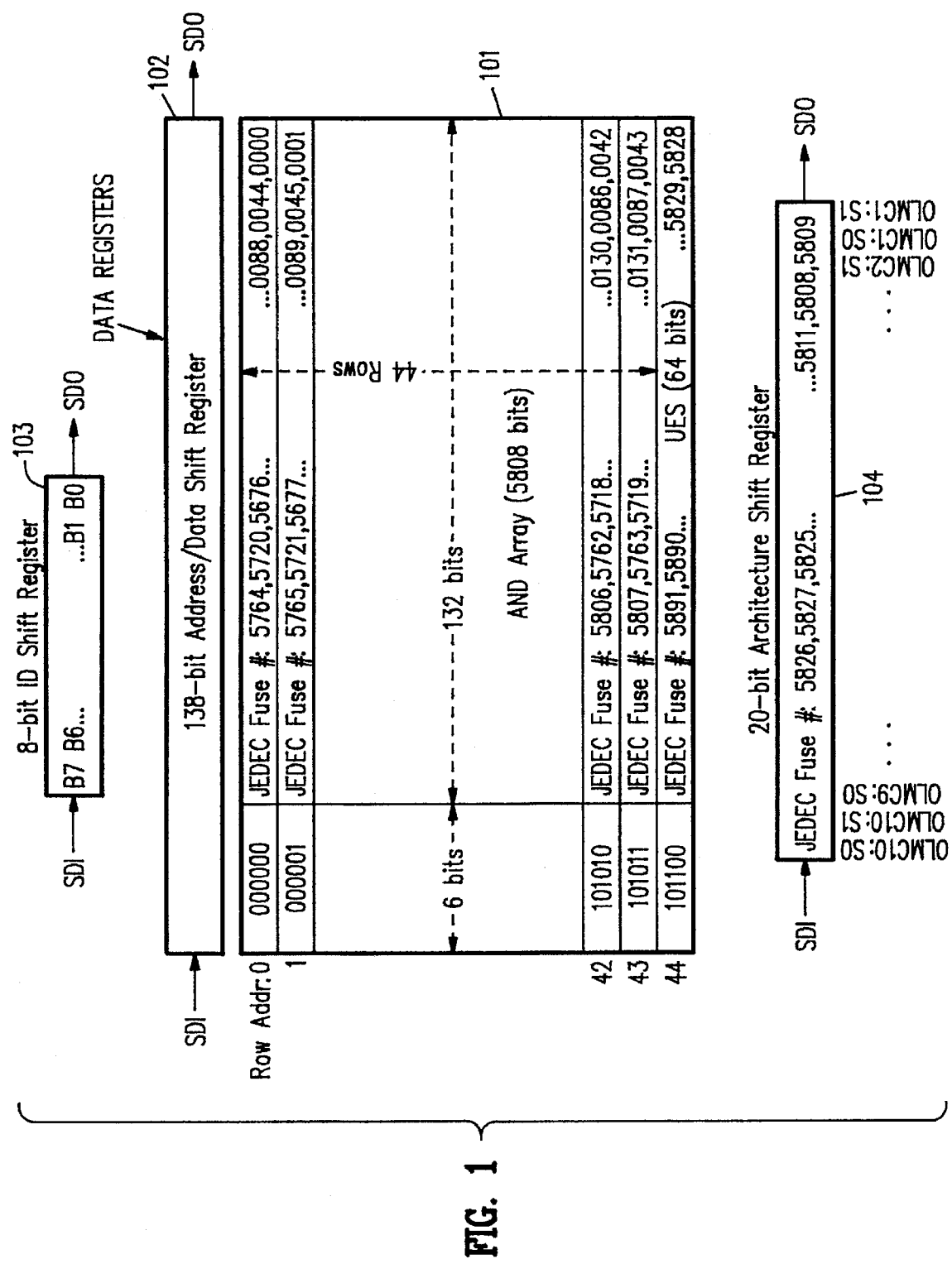
FIG. 1 shows an array map of an ispGAL22V10 device.

FIG. 1 shows an array map of the ispGAL22V10 device. As shown in FIG. 1, an ispGAL22V10 device is programmed by setting programmable fuses for a 44×132-bit AND array and a 64-bit "user electronic signature" (UES). Programming is accomplished one row at a time by serially shifting a 6-bit row address and 132 bits of program data bits into address/data shift register 102 through the SDI terminal. The 6-bit row address specifies which of the 44 rows of the AND array, or the 64-bit UES, is to be programmed. The 132 bits of programming bits are then provided to implement the desired configuration of the AND array at the specified row or the UES. An 8-bit ID shift register and a 20-bit architectural shift register 104 are provided, respectively, for storing an identification pattern and for specifying configuration information of the ispGAL22V10 device.

Figure 2:
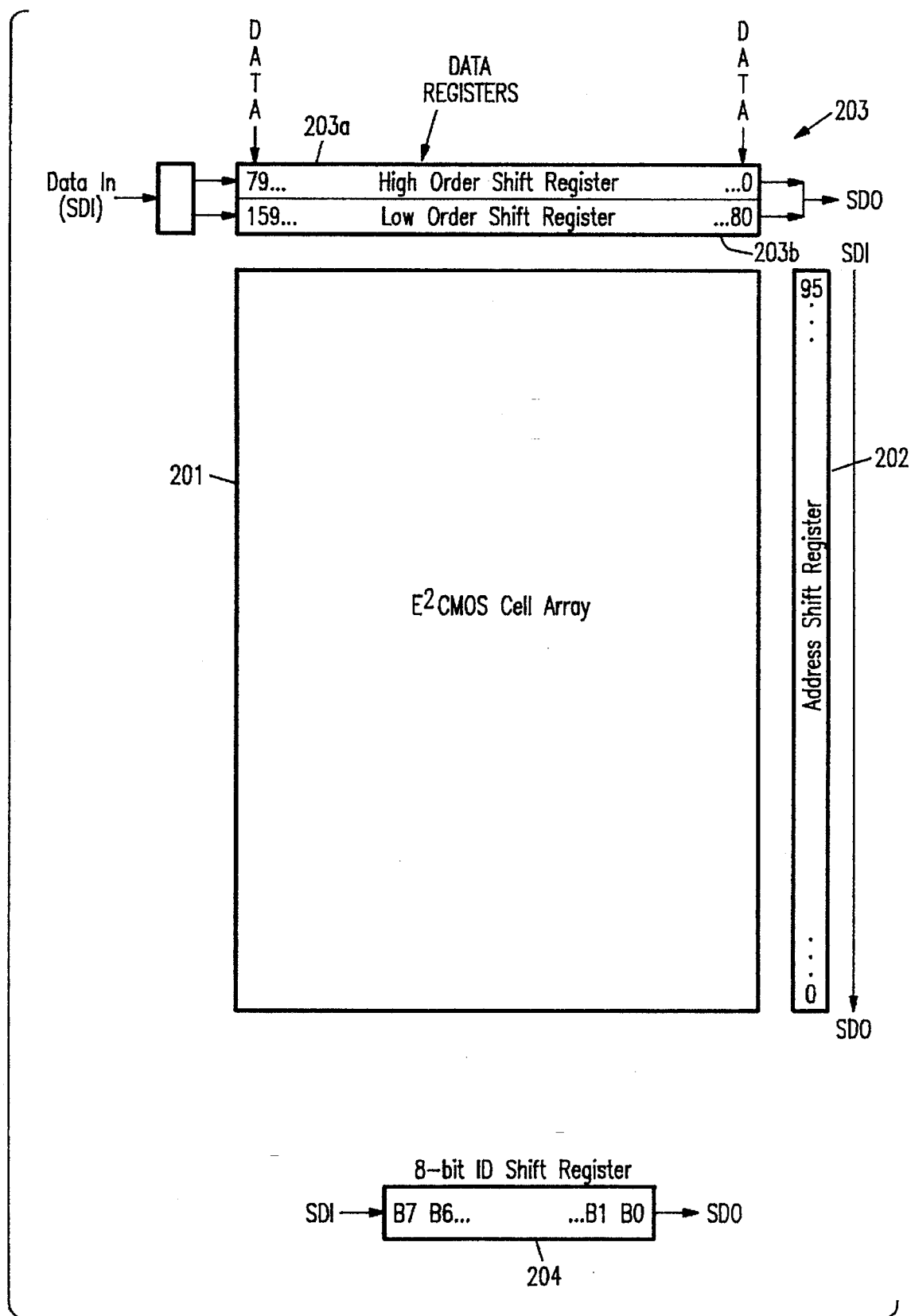
FIG. 2 shows an array map of an ispLSI 1016 device.

FIG. 2 shows the array map of an ispLSI 1016 device. As shown in FIG. 2, an ispLSI 1016 device includes a 96×160-bit E²CMOS (Electrically erasable Complementary Metal-Oxide Semiconductor) cell array 201. As in the ispGAL22V10 device, cell array of the ispLSI 1016 device is programmed row by row. However, instead of specifying a multi-bit address, a 96-bit address shift register 202 is provided. Each bit in address shift register 202 corresponds to a 160-bit row in cell array 201. A 160-bit data register 203, divided into 80-bit (half-row) high order register 203a and 80-bit low order shift register 203b, is provided for holding the program data bits. Since separate commands are required to load or read each half-row in data register 203 (i.e. a separate command is required for loading each of data registers 203a and 203b), for the purpose of the remaining discussion, the data input and output unit of ispLSI 1016 device can be considered to be the 80-bit half-row. To program the ispLSI 1016 device, a single '1' bit is shifted into address shift register 202. The position of the single '1' bit in address shift register 202 indicates the row to be programmed. Programming is carried out by two program instructions, "PRGMH" (program high half-row) or "PRGML" (program low half-row), each instruction writes a half-row program data bits in the corresponding one of data registers 203a and 203b into the corresponding half-row at the address indicated by the single '1' bit in address register 202. An 8-bit ID shift register 204 is provided for holding an 8-bit identification code.

Figure 3:
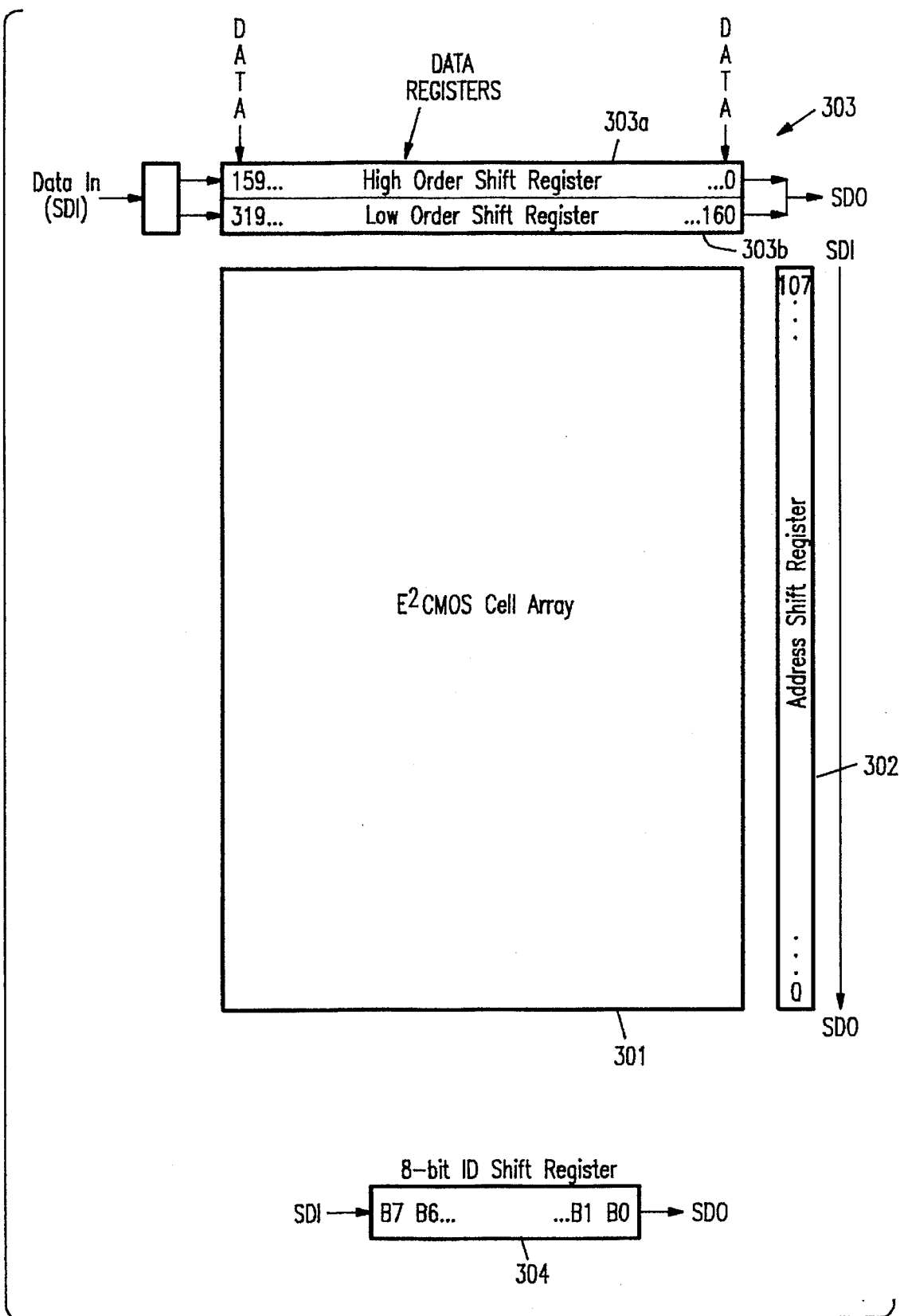
FIG. 3 shows an array map of an ispLSI 1032 device.

Programming an ispLSI 1032 device is similar to programming the ispLSI 1016 device described above with respect to FIG. 2. FIG. 3 shows the array map of an ispLSI 1032 device. An ispLSI 1032 device includes a 108 by 320-bit E²CMOS array 301. Thus, the ispLSI 1032 device includes a 108-bit address shift register 302 and a 320-bit data register 303, which is divided into higher order half-row data register 303a and low order half-row data register 303b. Again, since separate commands are required for loading or reading each of half-row data registers 303a and 303b, the input and output unit for data transfer in such the ispLSI 1032 device is 160 bits.

Figure 14:
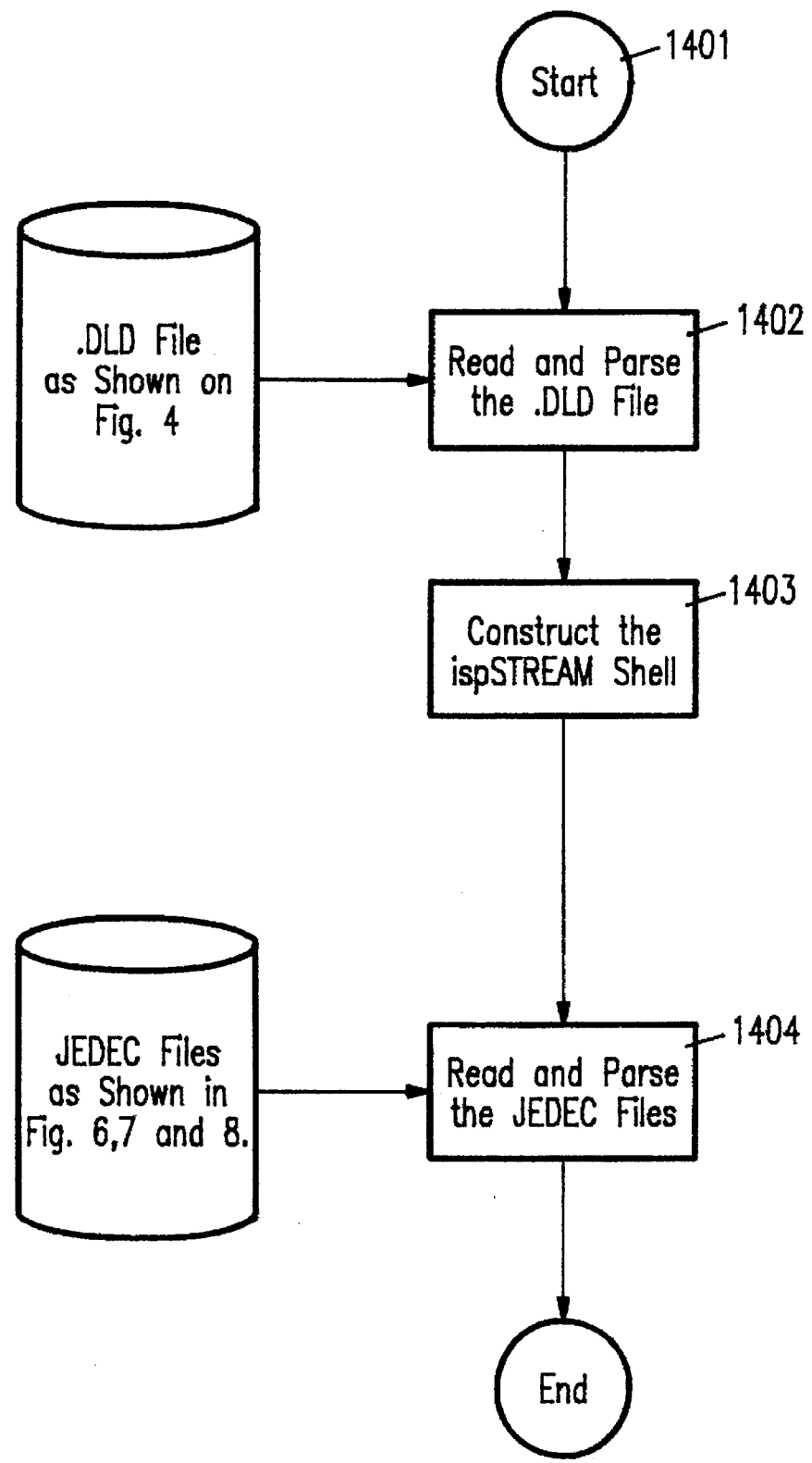
FIG. 14 is a flow diagram 1400 illustrating the creation of an ispSTREAM file in accordance with the present invention.

The method of the present invention first creates in memory an "ispSTREAM" file, which is a file containing both programming instructions and data, in the order the programming instructions and the data are subsequently used to program the ISP PLDs simultaneously. The steps for creating such a file are illustrated by FIG. 14. Step 1401, which represents a subroutine "pack_jedec_file" in the source code provided in Appendix A, begins compilation of the ispSTREAM file by invoking a subroutine "dl_read_dldfile". In FIG. 14, execution of subroutine "dl_read_dldfile" is represented by step 1402. At step 1402, a configuration description file (identified by the ".dld" file extension) is read. An example of such a configuration description file is shown in FIG. 5. As shown in FIG. 5, configuration description file 500 includes 3 lines of text, each line corresponding to one device in the serial chain 400 of FIG. 4 to be programmed. On each line of configuration description file 500 is provided three fields, which correspond to a (i) device field, (ii) a programming directive field, and (iii) a programming bit pattern field (i.e. the name of a "JEDEC file"). JEDEC is an industry standard format for specifying test vectors known to those skilled in the art. The device field identifies the type of the device to be programmed, so that device-specific commands and parameters can be properly handled by programming command generator 404. In FIG. 5, configuration description file 500 specifies 22V10 (i.e. the ispGa122v10 device), 1016 (an ispLSI device with 16 generic logic blocks) and 1032 (an ispLSI device with 32 generic logic blocks). At present, four types of programming directives are used: (i) "PV", which indicates both programming and verification are to be performed; (ii) "NOP", which indicates no operation; (iii) "V", which indicates only verification is to be performed, and (iv) "E", which indicates only the function "erase" is to be performed. Verification involves reading the programming data from a programmed logic device and comparing the data thus read-back with the expected bit pattern. The function "erase" erases all programming from a ISP PLD.

The "JEDEC file" field of configuration description file 500 provides the name of the JEDEC file containing a programming bit pattern for use by Programming command generator 404 when carrying out the specified programming directive. In addition, step 1402 (FIG. 14) identifies, for each device listed on the configuration description file 500, the number of rows and the size in bit number of each row. Step 1402 also identifies which of the devices in the serially connected chain 400 has the largest number of programmable units, defined as the largest number of rows in the ispGAL22V10 type devices, or the largest number of half-rows in the ispLSI type devices, whichever is larger.

Figure 9:
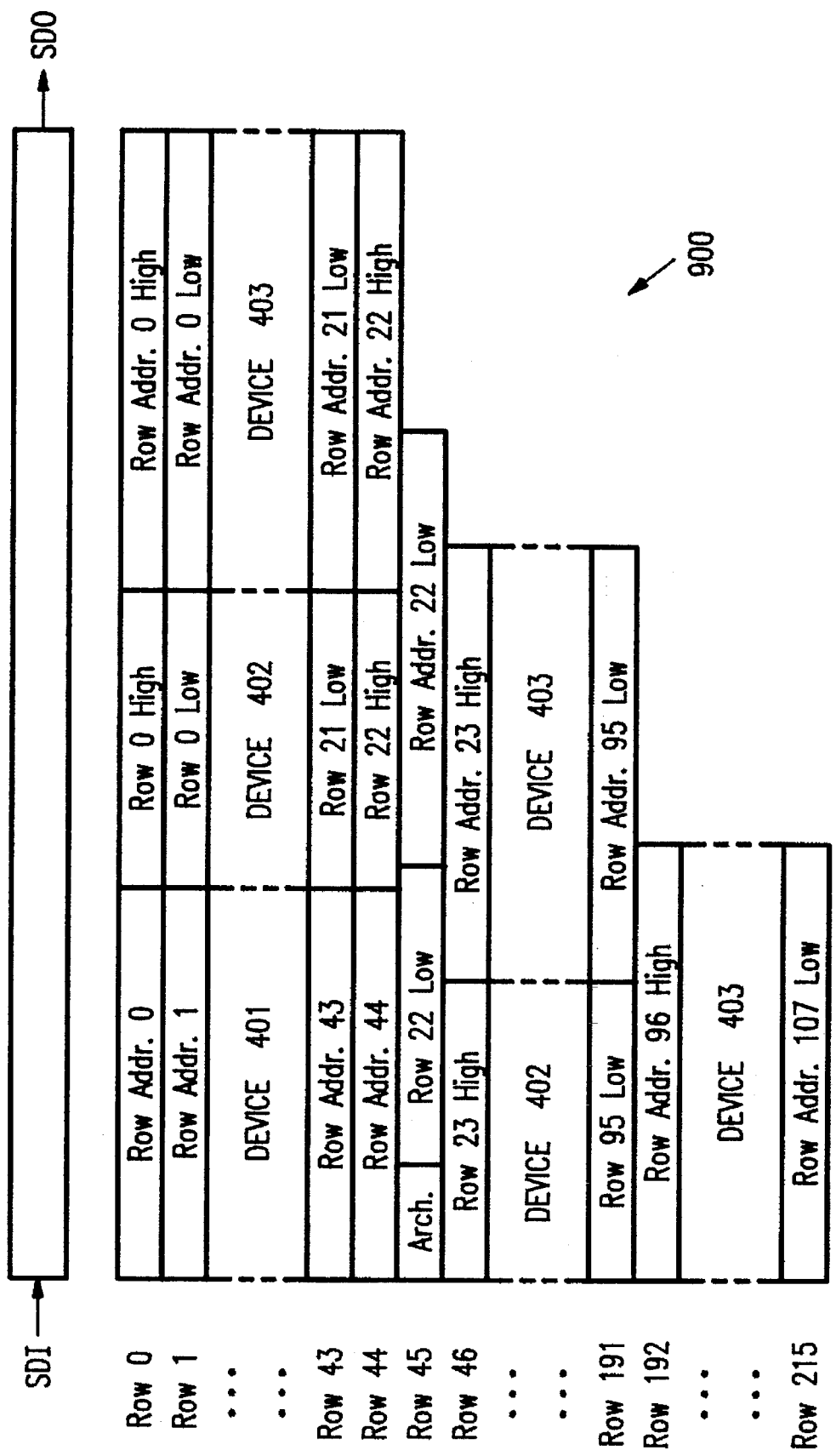
FIG. 9 illustrates the composite array map for serially connected chain 400 of FIG. 4.

Upon completion of Step 1402 described above, step 1403 is invoked to calculate a "composite array map". The present invention considers serially connected chain 400 as if it is a device having a number of rows equal to the largest number of programmable units, as identified in step 1402 above. For example, the serially connected chain of FIG. 4 is considered a device having (i) 45 rows (rows 0–44) of 378 bits; (ii) one row (row 45) of 260 bits, (iii) 146 (rows 46–191) of 240 bits, and (iv) 24 rows (rows 192–215) of 160 bits. FIG. 9 illustrates this composite array map for the serially connected chain 400 of FIG. 4. As shown in FIG. 9, in rows 0–44, one row from ISP PLD 401 and two half-rows from each of the ISP PLDs 402 and 403 can be programmed simultaneously. Thus, the total number of bits programmed in each of rows 0–44 would be the sum of 138 bits, 80 bits and 160 bits, i.e. 378 bits. Row 45 represents the programming of the 20 architectural bits and one half-row each of ISP PLDs 402 and 403. Thus, the number of bits to be programmed in row 45 is the sum of 20, 80 and 160, i.e. 260 bits. For rows 46–191, since ISP PLD 401 does not have these rows, the number of bits to be programmed is the sum of two half-rows of ISP PLDs 402 and 403. Thus, the number of bits programmed in rows 46–191 is the sum of 80 and 160, i.e. 240 bits. Finally, in rows 192–215, only ISP PLD 403 need to be programmed. Hence, the number of bits to be programmed in rows 192–215 is one half-row of ISP PLD 403, i.e. 160 bits.

Figure 10A:
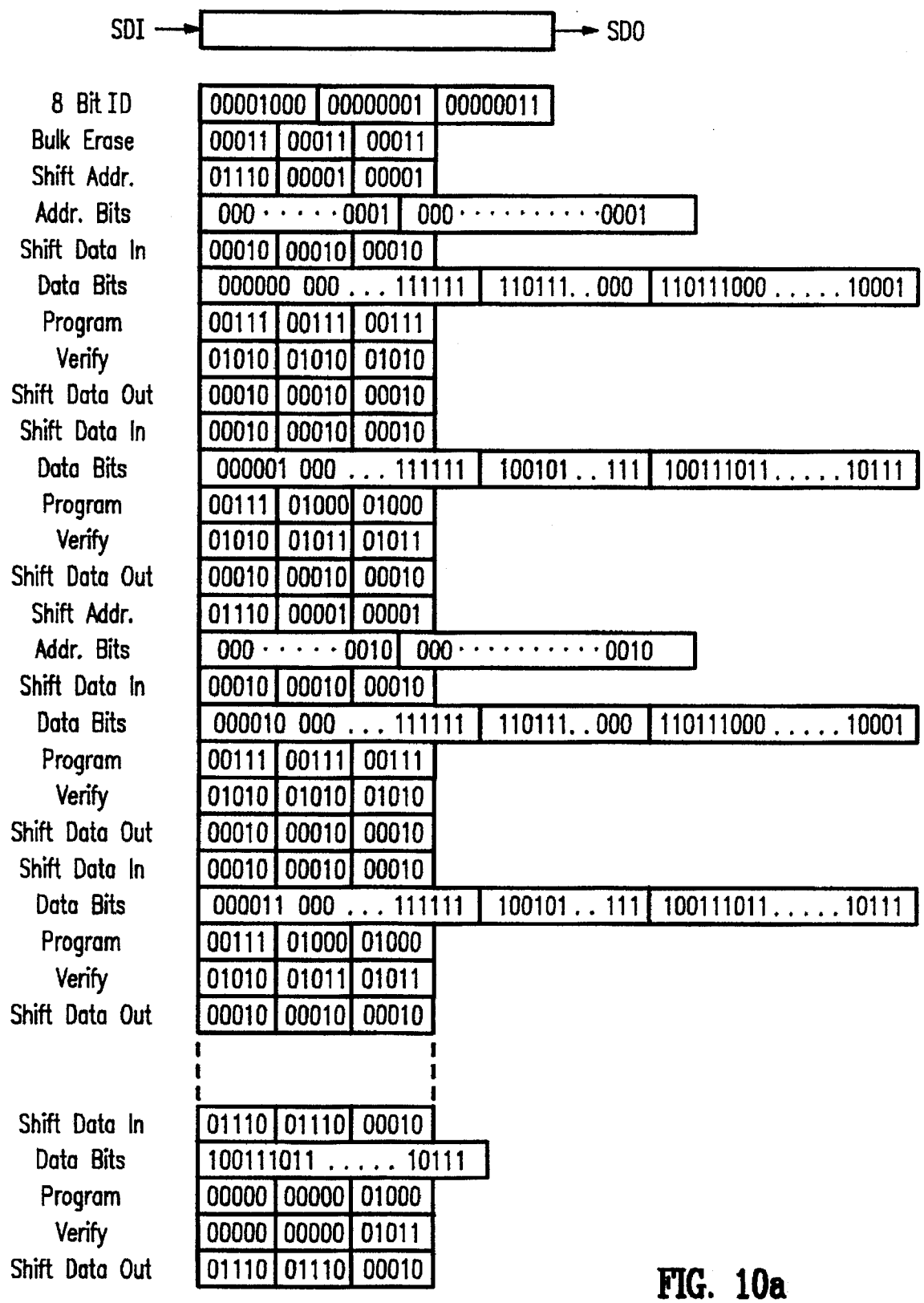
FIG. 10a shows actual instructions and program data bits, which are derived from the JEDEC files of FIGS. 6–8, provided to ispSTREAM file 1000 of FIG. 10b below.
Figure 10B:
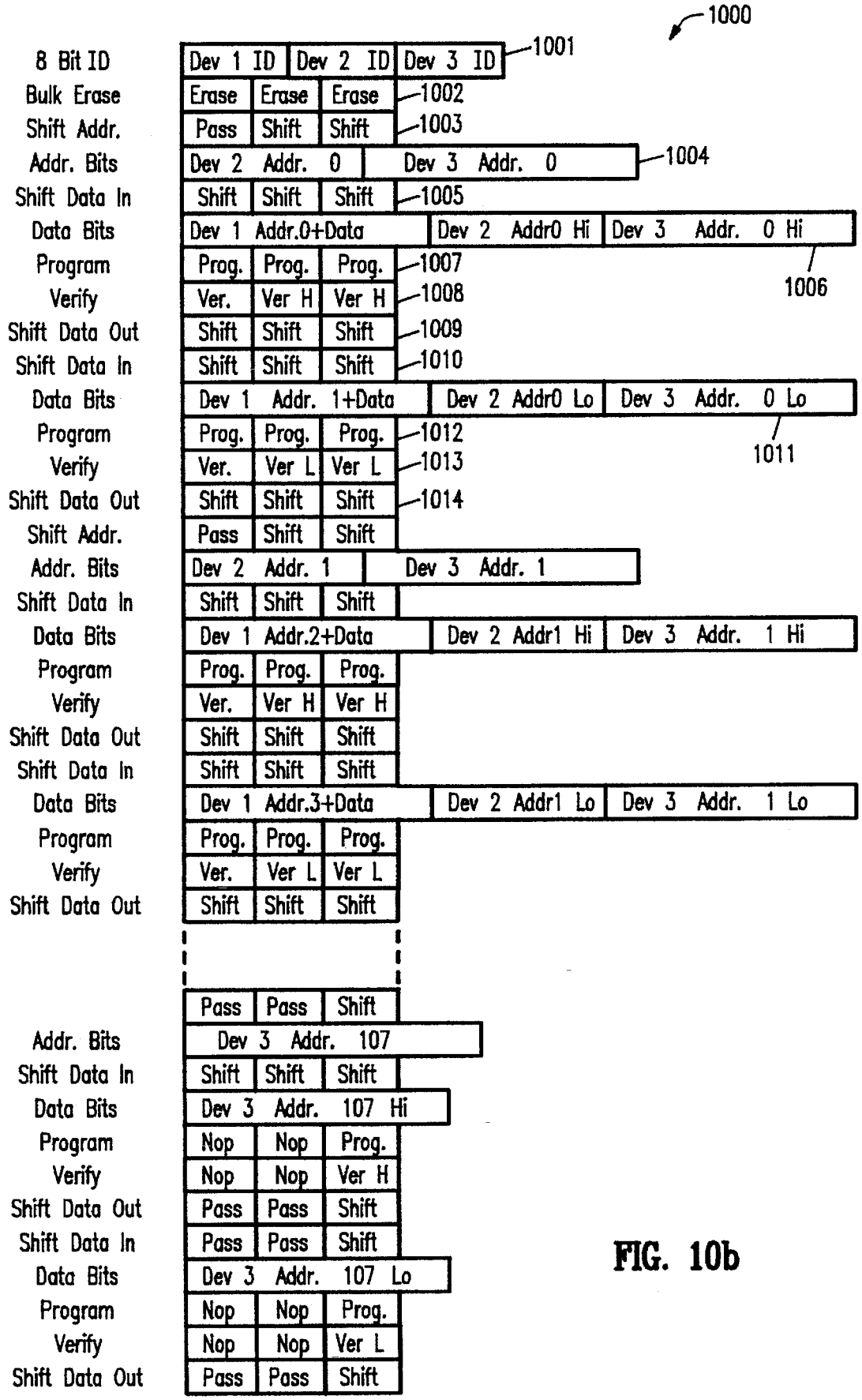
FIG. 10b shows the format of an ispSTREAM file 1000 for serially connected chain 400 of FIG. 4; serially connected chain 400 includes PLD ISPs 401, 402 and 403.

According to this composite array map, a bit stream file ("ispSTREAM file") is created in memory. The isp-STREAM file holds the bit stream data necessary to shift data and instructions into the serially connected chain of ISP PLDs (e.g. serially connected chain 400 of FIG. 4) to be programmed. FIG. 10b shows the format of an ispSTREAM file 1000 for the serially connected chain 400 of ISP PLDs 401–403 of FIG. 4.

Figure 16A:
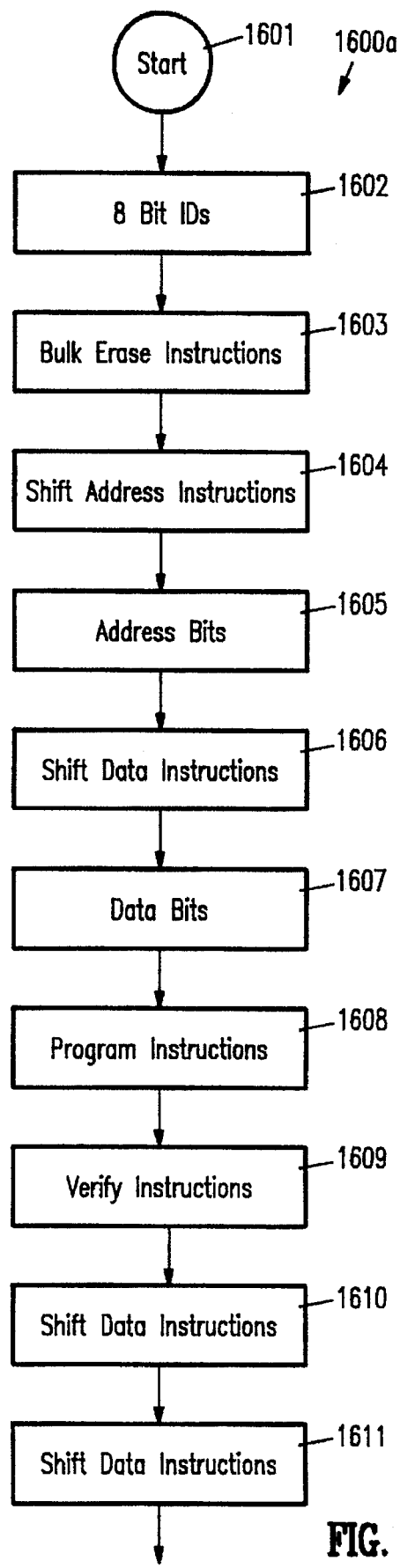
FIG. 16a is a portion 1600a of a flow diagram 1600 which illustrates allocation of the ispSTREAM file 1000 shown in FIGS. 10a and 10b.
Figure 16B:
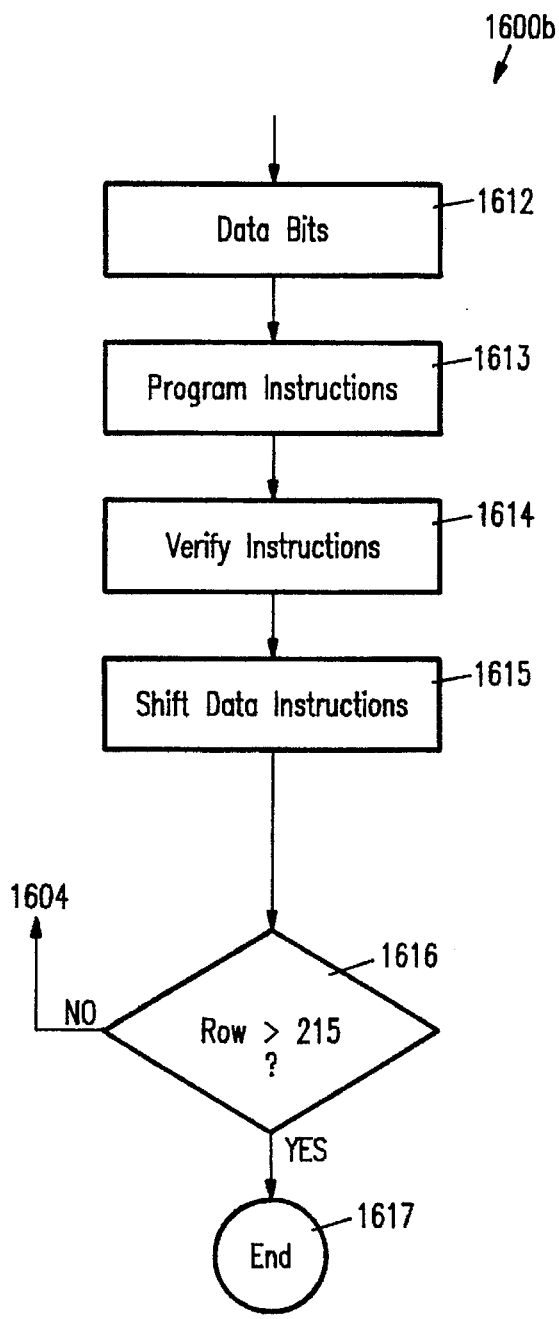
FIG. 16b is a portion 1600b of a flow diagram 1600 which illustrates allocation of the ispSTREAM file 1000 shown in FIGS. 10a and 10b.

To build ispSTREAM file 1000, the memory cells required for the ispSTREAM file is allocated. To perform this allocation, the procedure outlined in the flow diagram 1600, which is shown in two portions 1600a and 1600b in FIGS. 16a and 16b, is used. In FIG. 16a, step 1602 allocates 24 bits. These 24 bits are provided to contain the three 8-bit ID code for each of ISP PLDs 401, 402 and 403. At step 1603, 15 bits are allocated for holding a 5-bit instruction of each of ISP PLDs 401, 402 and 403 for a bulk erase instruction. The instruction sets executable by the state machines of the ispGAL22V10 type devices (e.g. ISP PLD 401) and the ispLSI type devices (e.g. ISP PLDs 402 and 403) are shown in FIGS. 10c and 10d respectively. FIGS. 10c and 10d provide, for each instruction, the opcode for the instruction, a mnemonic of the instruction and a short description of the function of the instruction. As shown in FIG. 10b, for example, the bulk erase instruction in an ispLSI type device has an opcode '00011' (binary) and an mnemonic "UBE". The UBE instruction erases the programming in the entire device by setting all the programmable bits to a binary '1'.

Then, at step 1604, 15 bits (bits 1003) are allocated for shifting into ISP PLDs 402 and 403 the 5-bit "ADDSHFT" instruction (FIG. 10c), and shifting into ISP PLD 401 the 5-bit "FLOWTHRU" (or "PASS") instruction. The FLOWTHRU instruction is provided ISP PLD 401 because an ispGAL22V10 type device does not have an address register, address being specified as the first 6 bits of data register 103. Then, 204 bits (bits 1004) are allocated, at step 1605 for the actual address bits to be shifted in the address registers 202 and 302 of ISP PLDs 402 and 403, respective. Since ISP PLDs 402 and 403 have 96 and 108 rows, respectively, the total number of bits allocated in bits 1004 for the actual address bits of ISP PLDs 402 and 403 is 204. At step 1606, 15 bits (bits 1005) are allocated for the data shifting instructions ("DATASHFT" or "SHIFT_DATA" in FIGS. 10c and 10d) for shifting data bits into data registers 102a, 203a and 303a. Then, at step 1607, a number of bits (bits 1006) are allocated for data to be shifted into in the first row (i.e. row 0) of composite array 900 (FIG. 9) constructed above. In the embodiment of FIG. 4, as explained above, row 0 includes 378 data bits, including 6 address bits and 132 data bits for ISP PLD 401, 80 data bits for ISP PLD 402 and 160 data bits for ISP PLD 403. In the next two steps, i.e. steps 1608 and 1609, 30 bits (bits 1007 and 1008) are allocated for the program instructions ("PROGRAM" and "PRGMH") and the verify instructions ("VER/LDH" or "VERIFY") used in programming ISP PLDs 401–403. PRGMH and VER/LDH are instructions which program and verify, respectively, using data in the higher half-row portion of the data registers of the ispLSI devices (e.g. half-row data registers 203a and 303a). Step 1610 allocates 15 bits (bits 1010) for holding the "DATASHFT" and "SHIFT_DATA" instructions for shifting data out of data registers PLDs ISPs 402 and 403, and ISP PLD 401 respectively. Steps 1611–1615 (steps 1612–1615 shown in FIG. 16b) are steps corresponding to steps 1606–1610 described above. Steps 1611–1615 are provided for processing the next row of ISP PLD 401 and the lower 160-bit and 360-bit half-rows of ISP PLDs 402 and 403, at the address specified by address registers 202 and 302, respectively. Steps 1611–1615 allocate in the ispSTREAM file structures 1010–1014. Steps 1604–1615 are repeated for rows 2 to 215 of composite array map 900 until row 215 (see FIG. 9) is processed. This repetitive loop and the termination decision point are represented by decision point 1616. For row 45, the data bits allocated for step 1612 is 260, as discussed above. Similarly, for rows 46–191 the data bits allocated for steps 1607 and 1612 are 240 bits. For rows 192–215, the data bits allocated for steps 1607 and 1612 are 160 bits. For rows 192–195, since all rows in ISP PLD 402 are programmed, the number of bits allocated for the address bits of step 1605 is 108, which is the number of rows for ISP PLD 403.

Referring back to FIG. 14, upon allocation of isp-STREAM file 1000, step 1403 is completed. Then, the next step, i.e. step 1404 (execution of subroutine "pack_jedec_files" continues), invokes a subroutine "read_jedec_files". Step 1404 reads the JEDEC files referenced in configuration description file 500 one by one, and converts the information in each JEDEC file (provided in ASCII characters) into a packed binary map in memory, organized row by row. As each JEDEC file is read, each row (for ispGAL22V10 type device) or half-row (for ispLSI type device) that is all '1's (i.e. all program bits in the row are binary '1's) is marked. In a preferred embodiment, after all program bits in the JEDEC file are read into the packed binary map in memory, the rows or half-rows in the packed binary map are sorted. In ispGAL22V10 devices, the rows are sorted such that the rows that are not all binary '1's are arranged in ascending address order, followed by the all '1's rows in ascending address order. In ispLSI devices, the rows are sorted in the data structure in the order: 1) in ascending address order, all rows which are not all '1's in both the higher and the lower half-rows of an address; (ii) in ascending address order, all rows which have all '1's in one of the half-rows, and not all '1's in the other half-row; and (iii) in ascending address order, all rows which are all '1's in both half-words.

Figure 7A:
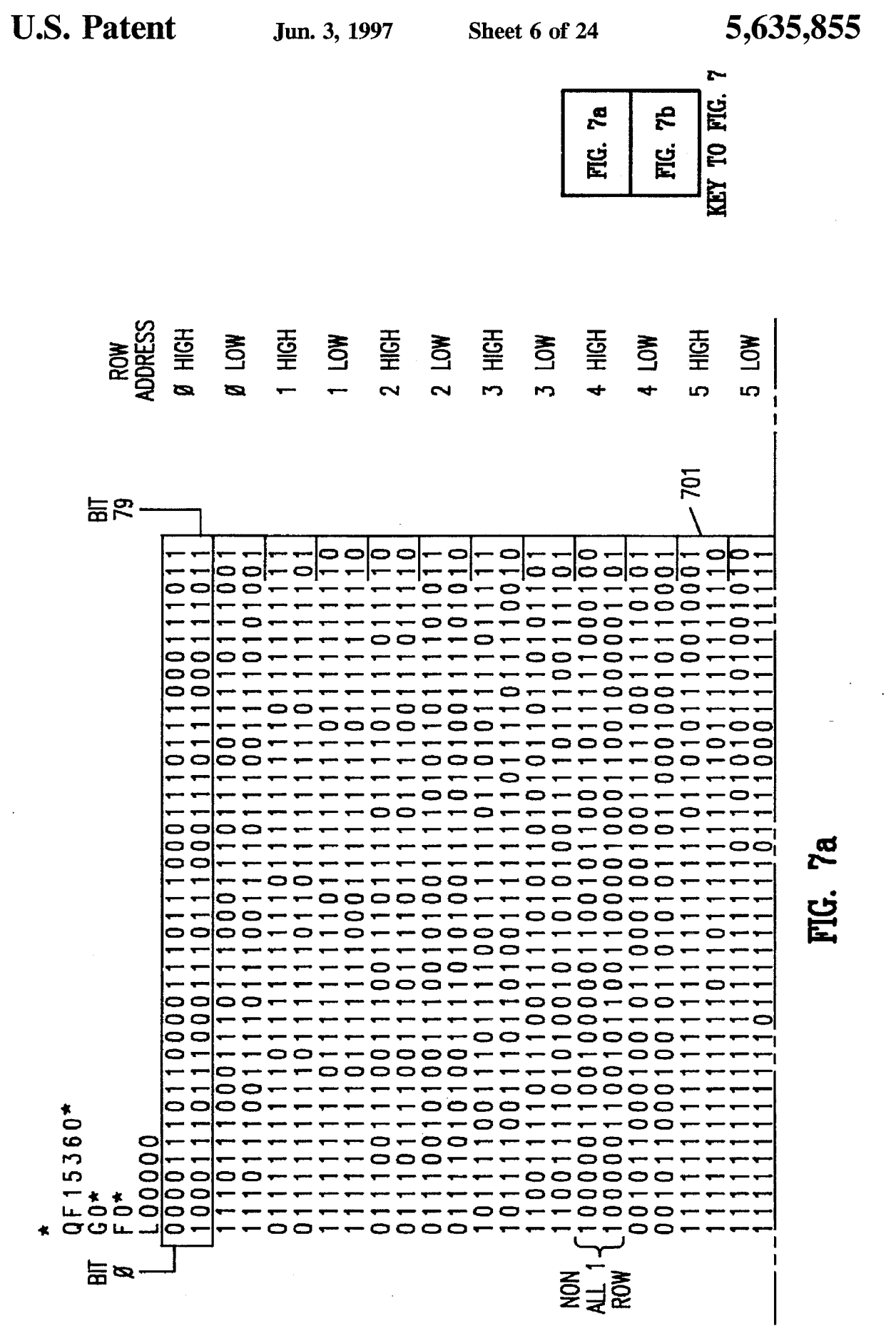
Figure 7B:
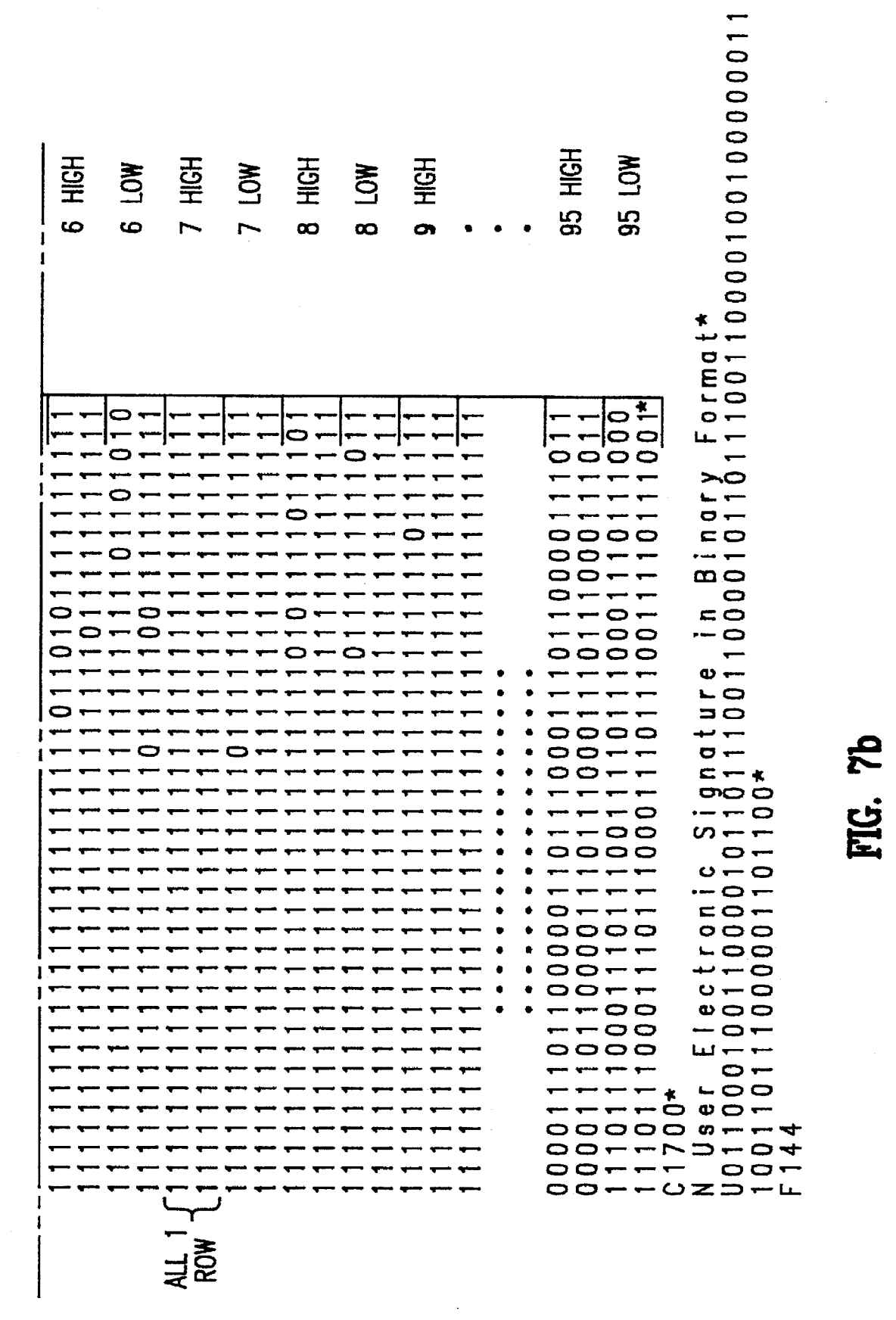
Figure 8A:
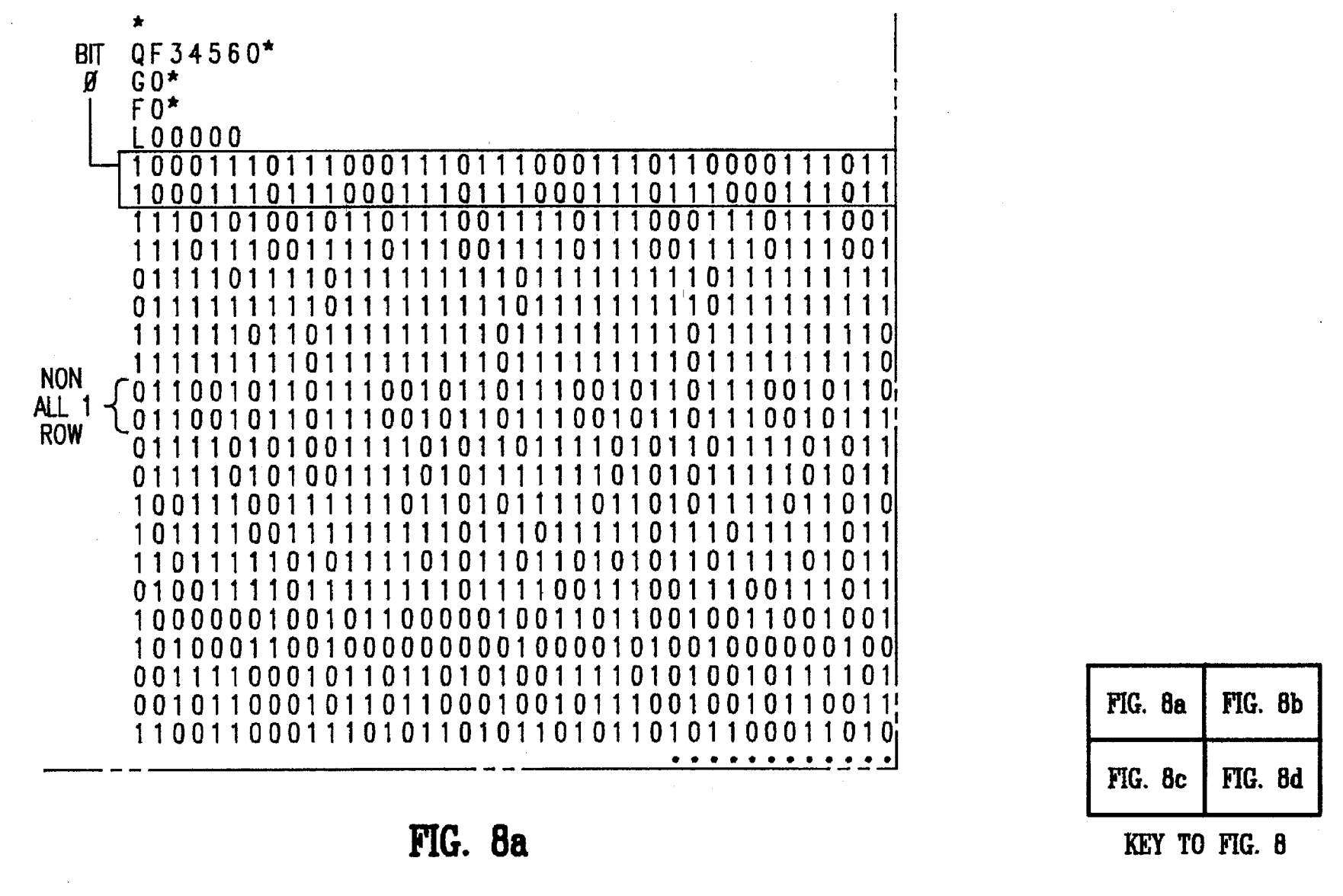
Figure 8B:
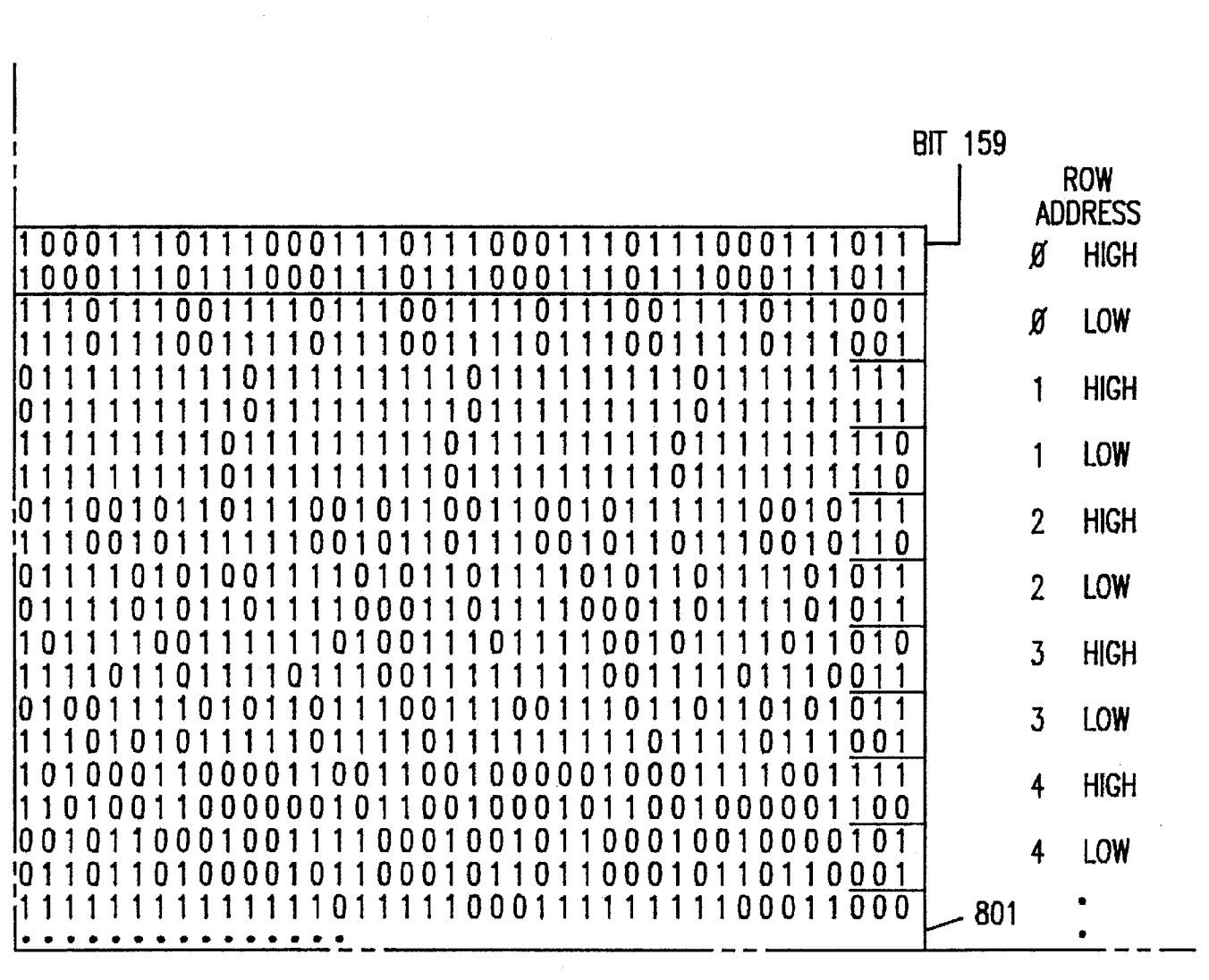
Figure 8C:
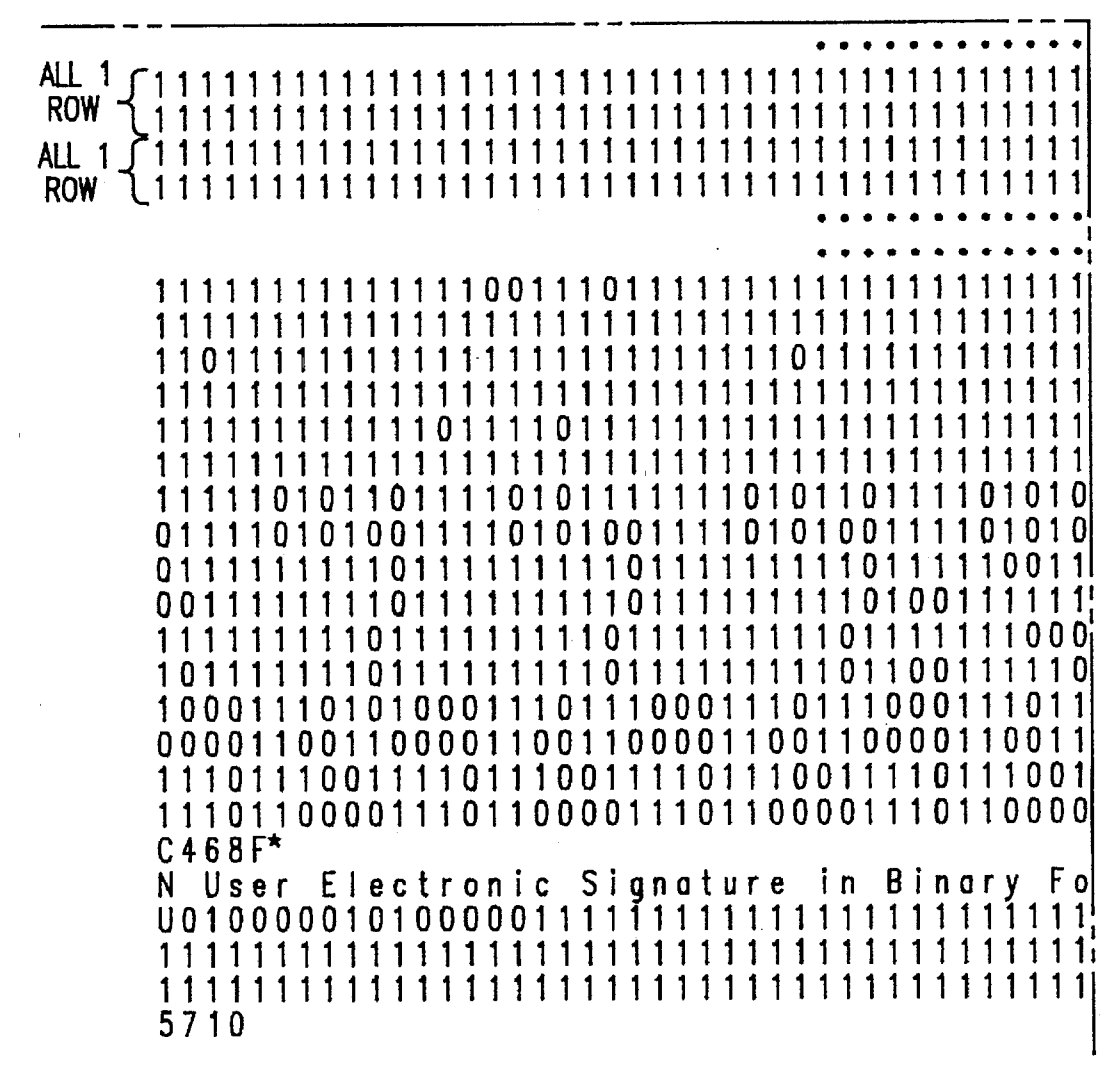
Figure 8D:
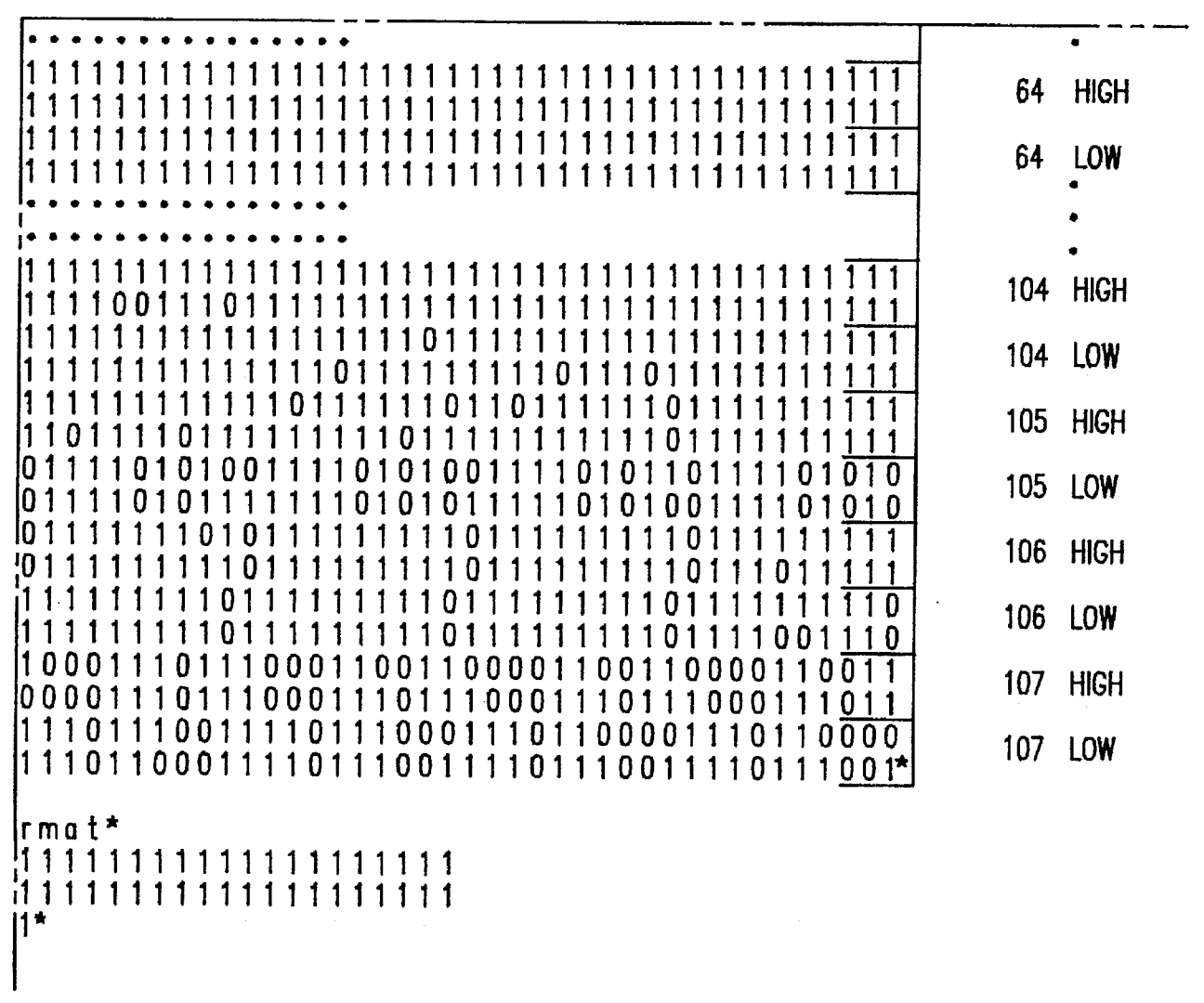

FIGS. 6, 7 and 8 are JEDEC files illustrative of the JEDEC files referenced in FIG. 5 for ISP PLDs 401, 402 and 403 respectively. As shown in FIG. 6, a JEDEC file for an ispGAL22V10 device reads program bits from a 44×132-bit array 601. Each column of bit array 601 corresponds to the 132 programming bits for a row in the AND array 101 of FIG. 1. In combination with a 6-bit address generated by programming command generator 404 (FIG. 4), these 132 bits programming bits are shifted into address/data shift register 102 to program a row of AND array 101. The remaining portions of the JEDEC file provides information such as the 20 architectural bits, and the 64-bit UES. The format for a JEDEC file used with an ispGAL22V10 device is known to one skilled in the art.

FIG. 7 shows a JEDEC file for an ispLSI 1016 device, illustrative of the "1016.jed" file referenced in FIG. 5 for ISP PLD 402 of FIG. 4. As shown in FIG. 7, program bits are read by Programming command generator 404 from a 192×80-bit array 701. Unlike array 601, i.e. the program bits array of a JEDEC file for an ispGAL22V10 device, where each column represents a row of programmable components in the device, every two rows of array 701 represent the program bits for either the higher order half-row or the lower order half-row of a corresponding row in the E²CMOS array of the ispLSI device. Programming is achieved when the program bits are downloaded, by executing the appropriate programming command, onto the target ISP PLD from data registers 203a and 203b. FIG. 8, which shows a JEDEC file illustrative of the JEDEC file "1016.jed" referenced in FIG. 5 for ISP PLD 402, contains a 108×160-bit array 801 which is interpreted in the same manner as array 701 of FIG. 7. Of course, every two rows in array 801 has 160 bits, corresponding to either the 160-bit higher order half-row, or the 160-bit lower order half-row, for a 320-bit row of the E²CMOS array 201 of a ispLSI 1032 device. As an example, FIG. 7 shows that the higher order half-row of program bits at address 7 is all '1's. Similarly, FIG. 8 shows that both half-rows of the program bits at address 64 are all '1's. The next step in step 1404 is to fill actual program and command data into the ispSTREAM file 1000. The procedure for filling ispSTREAM file 1000 is provided as procedure 1700 in FIGS. 17a and 17b.

Figure 17A:
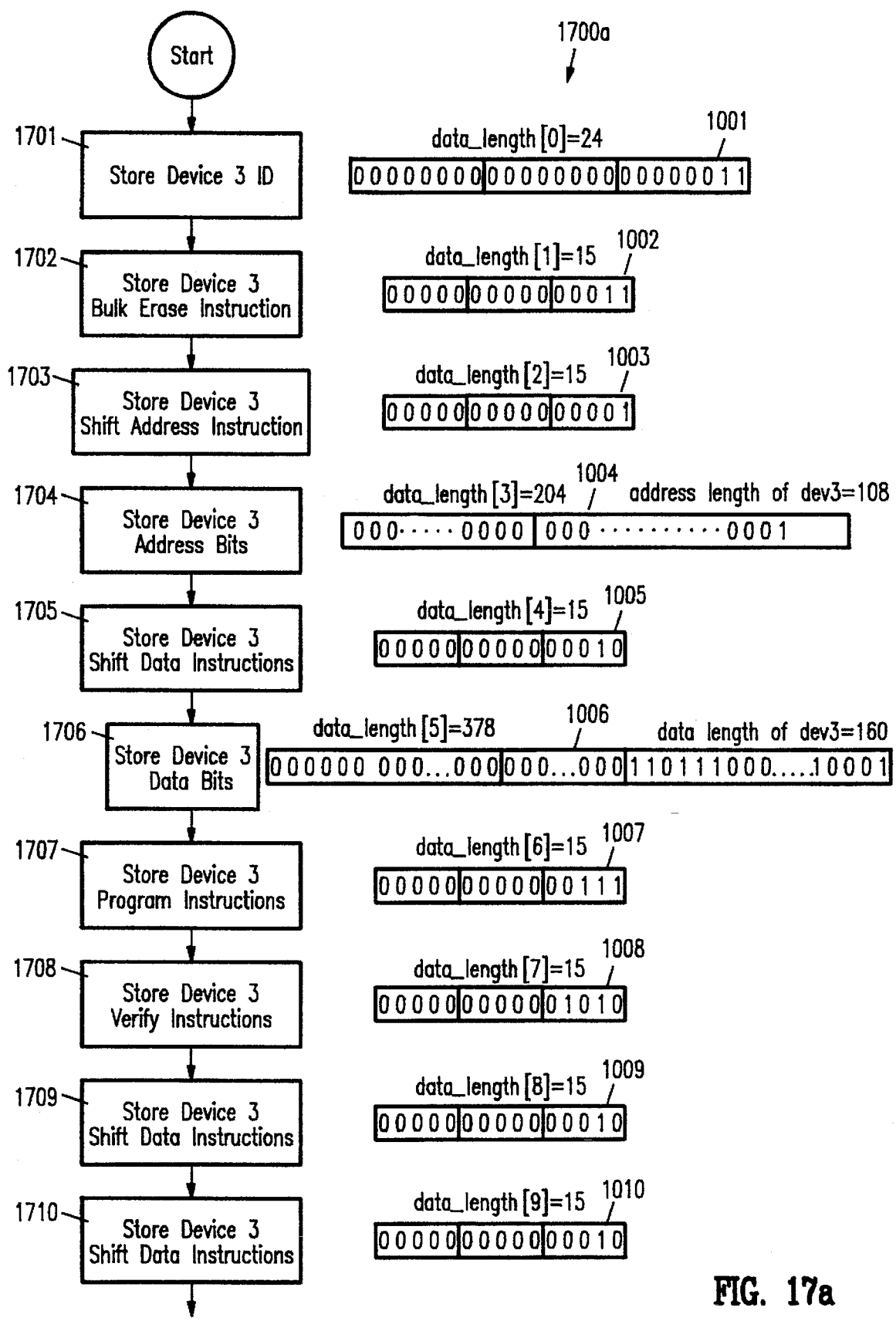
FIG. 17a shows, as a portion 1700a of a flow diagram 1700, on the left hand side, steps 1701–1714 taken to fill program data into ispSTREAM file 1000 and, on the right side, actual program data which are filled into data structures 1001–1014 of ispSTREAM file 1000 shown in FIG. 10b.
Figure 17B:
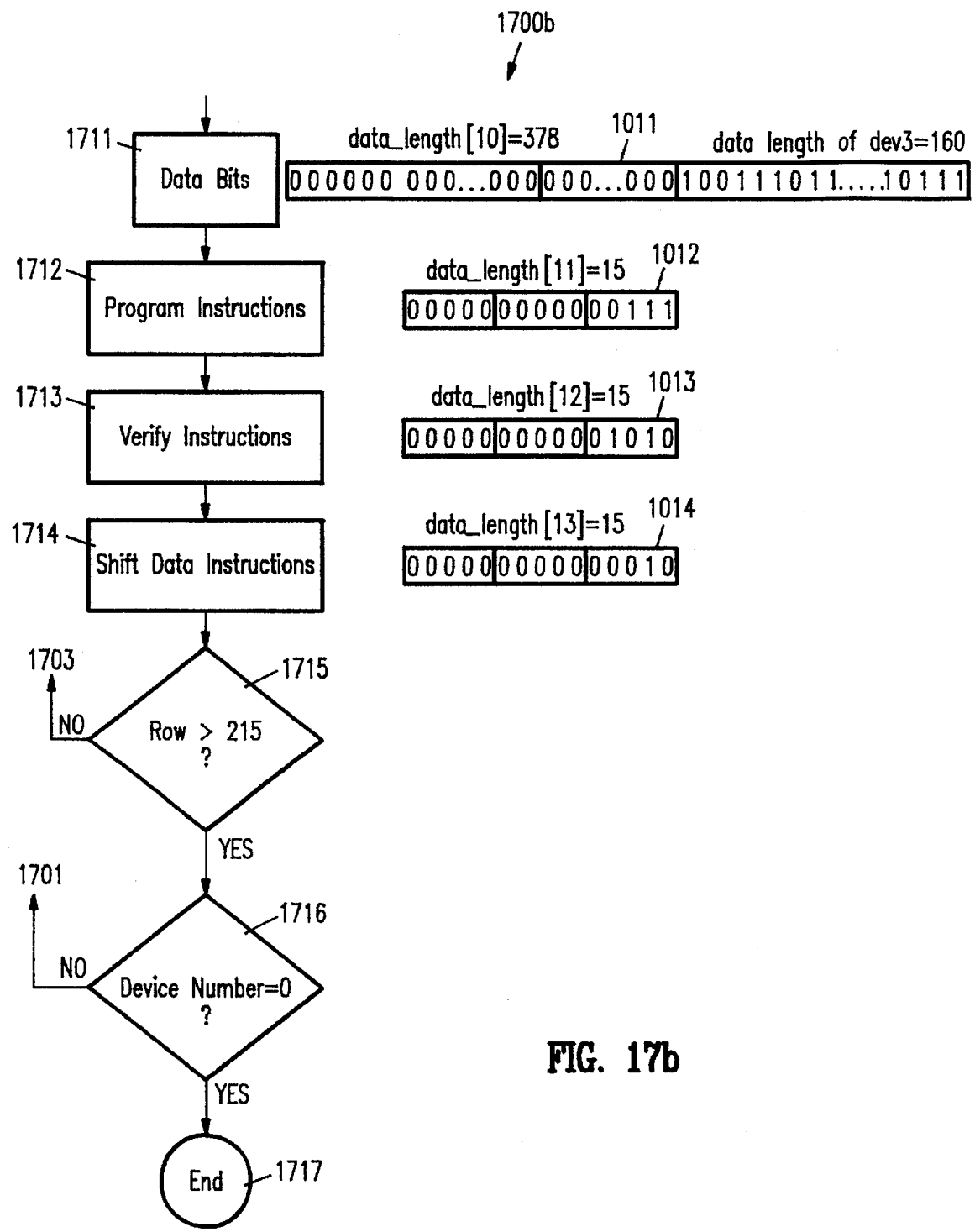
FIG. 17b shows, as a portion 1700b of a flow diagram 1700, on the left hand side, steps 1701–1714 taken to fill program data into ispSTREAM file 1000 and, on the right side, actual program data which are filled into data structures 1001–1014 of ispSTREAM file 1000 shown in FIG. 10b.

FIGS. 17a and 17b are portions 1700a and 1700b of procedure 1700 respectively. FIG. 17a shows, on the left hand side, steps 1701–1710 taken to fill program data into ispSTREAM file 1000 and, on the right side, the actual program bits which are filled into data structures 10011-1019 of ispSTREAM file 1000 shown in FIG. 10b. FIG. 17b shows, on the left hand side, steps 1711–1717 taken to fill program data into ispSTREAM file 1000 and, on the right side, the actual program bits which are filled into data structures 1011–1014 of ispSTREAM file 1000 shown in FIG. 10b. Initially, as shown in FIG. 17a, program bits related to the last device in serially connected chain 400 is first processed. Thus, at step 1701, the 8-bit ID code filled the last 8 bits in data structure 1001 of ispSTREAM file 1000. Then, at the step 1702, the "UBE" instruction (user bulk erase) is entered into the corresponding 5 bits (i.e. the last 5 bits) of data structure 1002. The opcode corresponding to the "ADDSHFT" (address shift) instruction is then, at step 1703, entered into the last 5 bits of data structure 1003. The address bits to be shifted into address register 302 are provided in the last 108 bits of the data structure 1004. The opcode corresponding to the "DATASHFT" (data shift) instruction is then provided, at step 1705, to the last 5 bits of data structure 1005. Then, at step 1706, 160 program data bits, corresponding to the higher order half-row of the first row in the packed binary map for ISP PLD 403, are provided to the last 160 bits of the data structure 1006. At steps 1707 and 1708, the opcodes for "PRGMH" (program higher order half-row) and "VER/LDH" (verify or load higher order half-row) are provided into the corresponding bits of data structures 1007 and 1008. At step 1709, the opcode for the "DATASHFT" instruction is provided in the corresponding bits of data structure 1009. This "DATASHFT" instruction will be used to shift out the higher order half-word of ISP PLD 403, at the address specified in address register 303, for verification. The steps 1710–1714 provide, for the lower half-row of an ispLSI device, steps for filling the instruction opcodes and program data bits in data structures 1010–1014. Step 1715 tests if the command and program data bits for all rows of ISP PLD 403 are provided to ispSTREAM file 1000. If not all instructions and program data bits of ISP PLD 403 are provided to ispSTREAM file 1000, process 1700 repeats steps 1703–1714, until done. When all instructions and program data bits of this last device in serially connected chain 400 are provided to ispSTREAM file 1000, the next JEDEC file in configuration description 500 is read. Steps 1701–1715 are then repeated for filling in actual command and program data bits in ispSTREAM file 1000 corresponding to the next device in the serially connected chain 400 of FIG. 4. Process 1700 continues until commands and program data bits for all devices in serially connected chain 400 are provided into ispSTREAM file 1000. The result of process 1700 on serially connected chain 400, using program data bits from FIGS. 6–8, are shown in FIG. 10b. At this point, the subroutine "pack_jedec_files" is completed.

Simultaneous programming for the devices in the serially connected chain 400 can proceed then from the ispSTREAM file 100 thus filled. In this embodiment, a procedure "ispstream_pump" is provided for performing programming and verification from the ispSTREAM file. The ispstream_pump procedure is provided in source code form in Appendix A. A hardware and software system which is capable of downloading the output data of the ispstream_pump procedure for programming and verification in the devices of the serially connected chain is described in the ISP Manual 1994 referenced above. In particular, the hardware and software system and the operational procedures for operating such a system are discussed in Chapter 3 of the ISP Manual 1994, entitled "In-System Programming on a PC or Sun Workstation". The teachings of ISP Manual 1994 are hereby incorporated by reference in it's entirety.

Figure 15A:
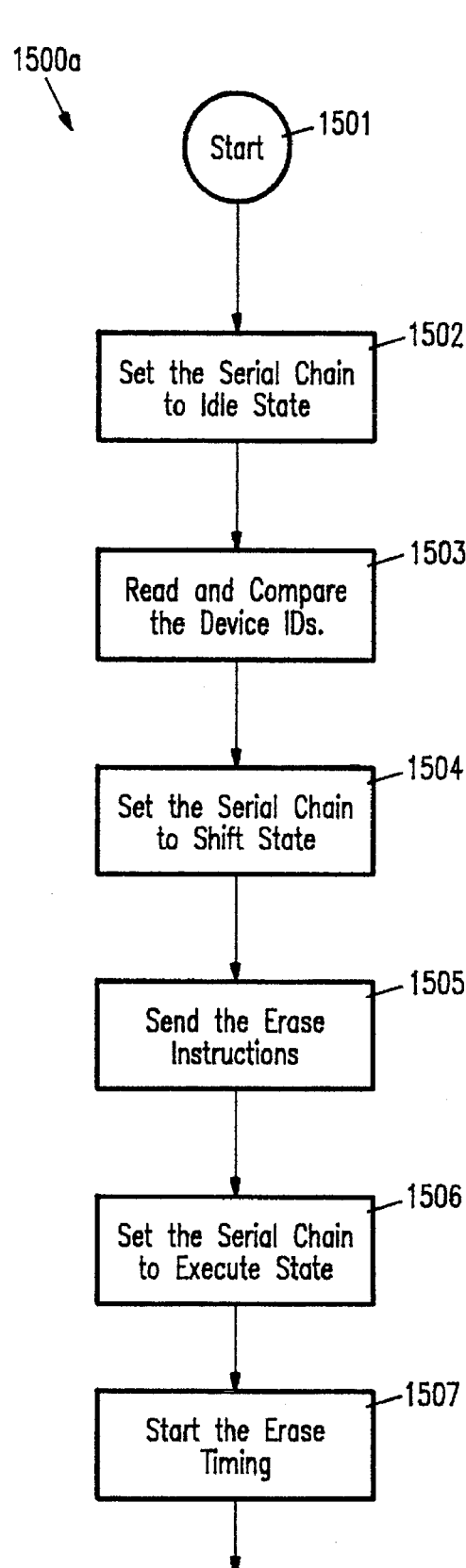
FIGS. 15a shows a portion 1500a of a flow diagram 1500, which shows a method for processing and downloading data of ispSTREAM file 1000 to target devices of serially connected chain 400 of FIG. 4.
Figure 15B:
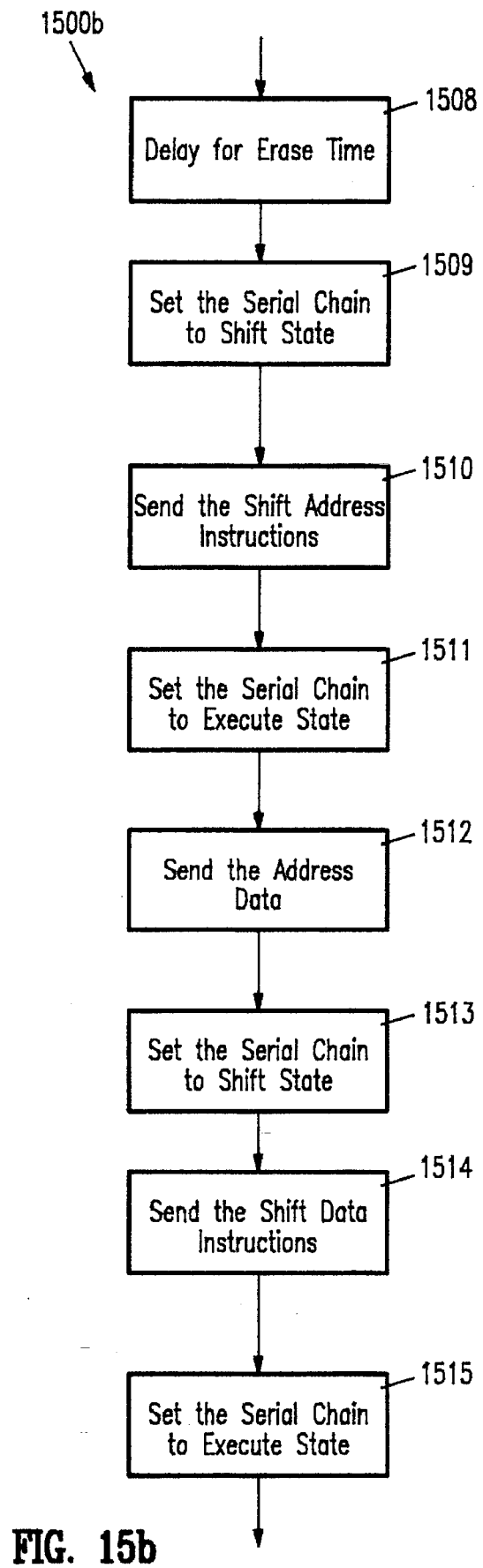
FIGS. 15b shows a portion 1500b of a flow diagram 1500, which shows a method of processing and downloading data of ispSTREAM file 1000 to target devices of serially connected chain 400 of FIG. 4.
Figure 15C:
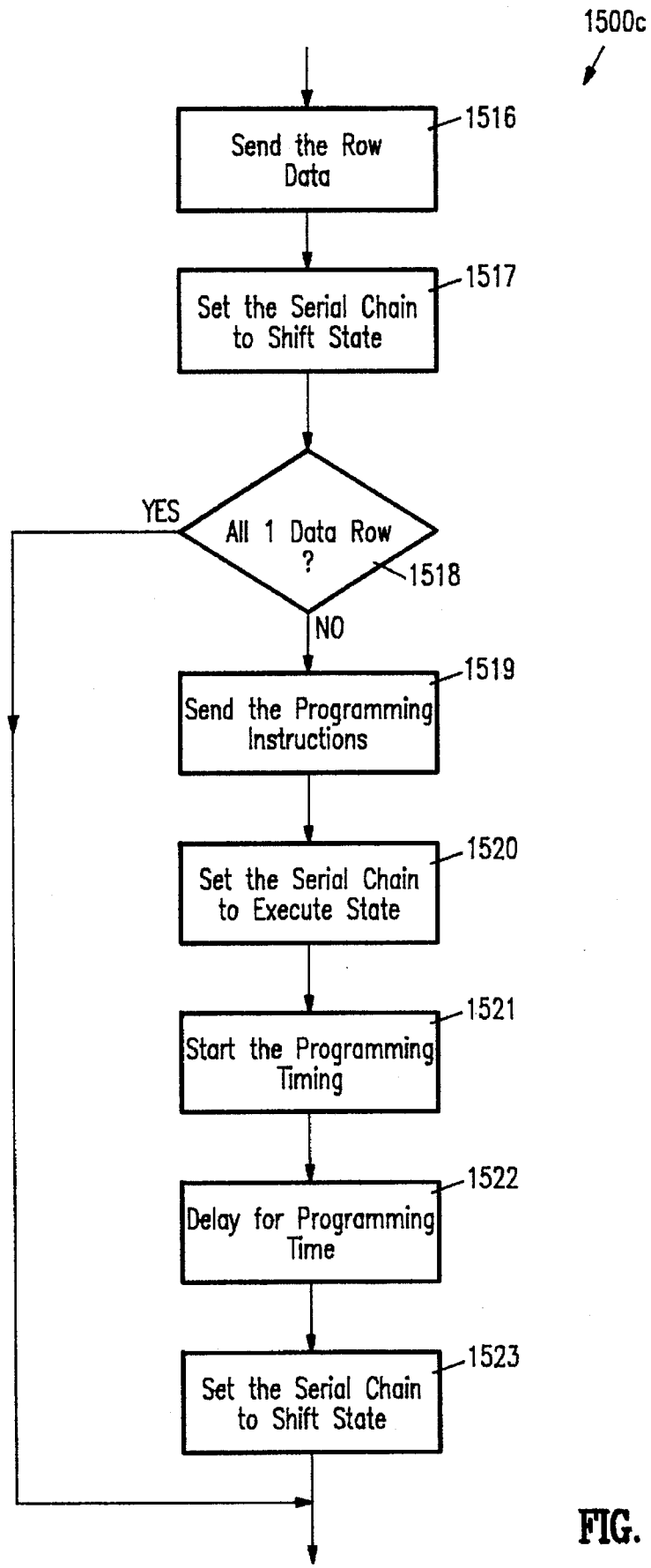
FIGS. 15c shows a portion 1500c of a flow diagram 1500, which shows a method for processing and downloading data of ispSTREAM file 1000 to target devices of serially connected chain 400 of FIG. 4.
Figures 15D, 15E:
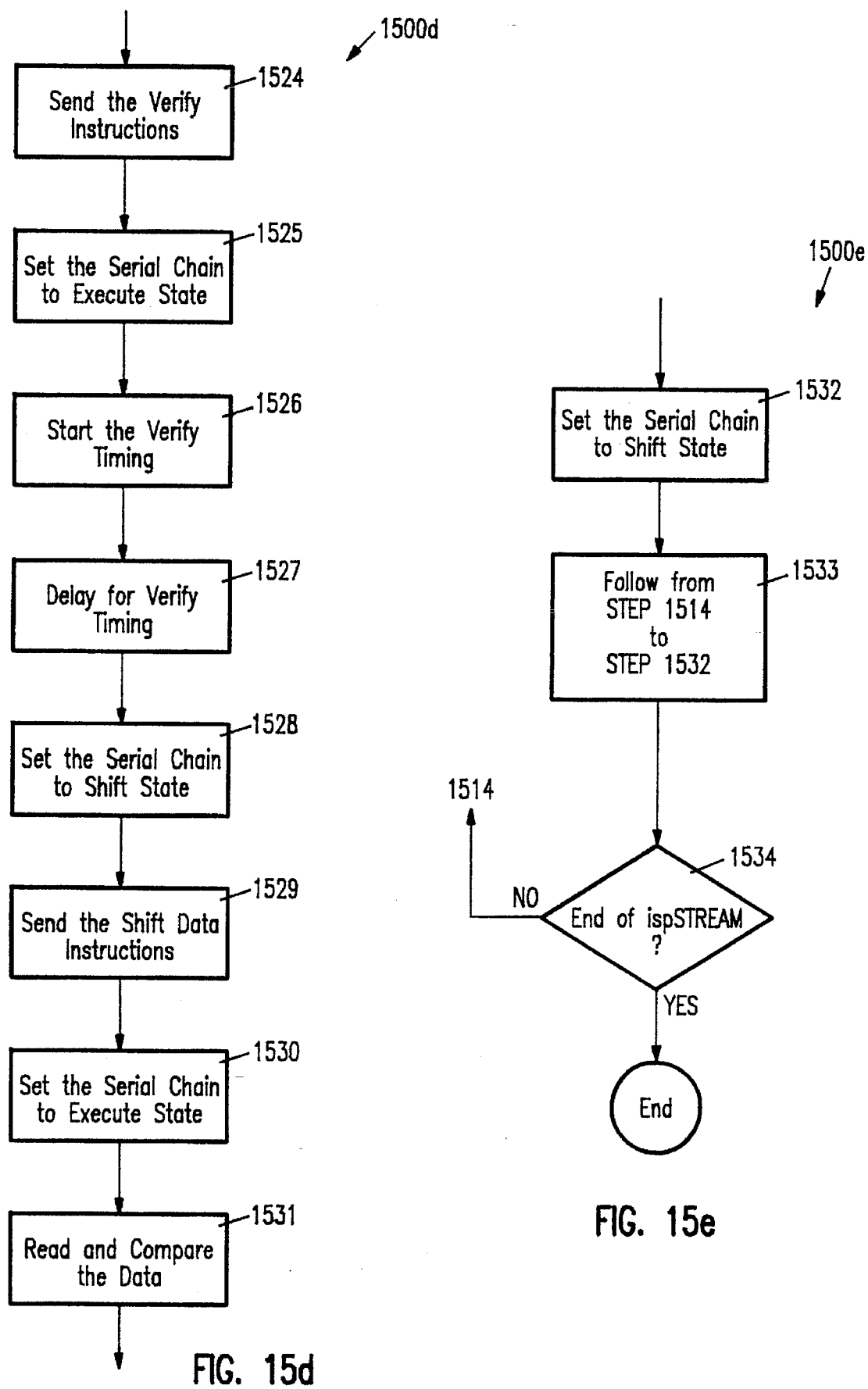
FIGS. 15d shows a portion 1500d of a flow diagram 1500, which shows a method for processing and downloading data of ispSTREAM file 1000 to target devices of serially connected chain 400 of FIG. 4.
FIGS. 15e shows a portion 1500e of a flow diagram 1500, which shows a method for processing and downloading data of ispSTREAM file 1000 to target devices of serially connected chain 400 of FIG. 4.

Specifically, a procedure for processing and downloading the data of ispSTREAM file 1000 to target devices in the serially connected chain 400 of FIG. 4 is illustrated in the flow diagram 1500, which is shown in 5 portions 1500a–1400e in FIGS. 15a–e. FIG. 15a shows a portion 1500a, including steps 1501–1507 of process 1500. As shown in FIG. 15a, at step 1501, the subroutine "ispstream_pump" is invoked to begin the process of processing and downloading data from ispSTREAM file 1000 to the target devices of serially connected chain 400 of FIG. 4. The subroutine "ispstream_pump" calls at step 1502, a subroutine "move_to_id_state", which causes all devices in the serially connected chain 400 to go into idle state. Idle state is entered when Programming command generator 404 (FIG. 4) provides the following signal protocol: (i) setting ispEN, SDI, SCLK and MODE signals each to logic low; (ii) following (i), setting MODE signal to logic high; (iii) following (ii), pulsing signal SCLK; and (iv) following (iii), resetting MODE signal to logic low.

Figure 18A:
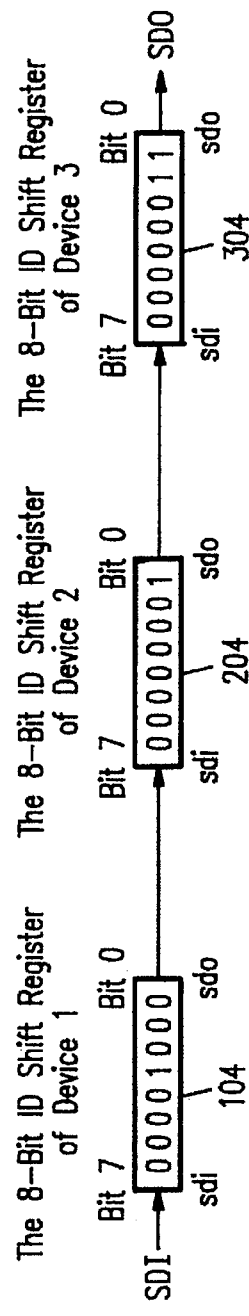
FIG. 18a shows the states of the three ID registers 104, 204 and 304 in ISP PLDs 401, 402 and 403 of serially connected chain 400.

FIG. 18a shows the states of the three ID registers 104, 204 and 304 in ISP PLDs 401, 402 and 403 of serially connected chain 400. At step 1503, command program generator 404 is caused to pulse the SCLK signal 24 times, so as to output as the values of signal SDO the respective ID codes of ISP PLDs 401, 402 and 403. These ID codes are then compared with the ID code values in data structure 1001 of ispSTREAM file 1000. At step 1504, the ispstream_pump subroutines calls the subroutine "execute ()" to place the devices in serially connected chain 400 into the "shift" state. The shift state is entered by causing command program generator 404 to execute the protocol: (i) setting ispEN, SDI, SCLK, MODE signals at logic low; (ii) thereafter, setting MODE and SDI signals to logic high; (iii) pulsing the SCLK signal once, and (iv) bringing the MODE and SDI signals to logic low. In the "shift" state, an in-circuit programmable device is ready to receive instructions for executing a command in a command register of the in-circuit programmable device.

Figure 11:
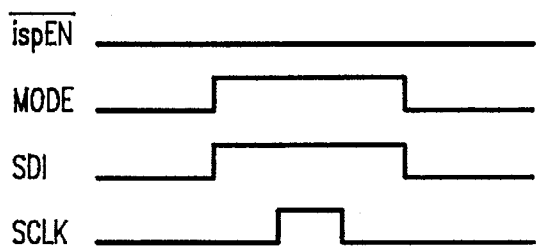
FIG. 11 is a signal protocol diagram showing transitions of signals ispEN, MODE, SCLK, and SDI when placing an ISP PLD into a "shift" state or an "execute" state.

At step 1505, the instructions for bulk erase, i.e. "BULK_ERASE", for an ispGAL22V10 type device and "UBE", for an ispLSI type device, are taken from data structure 1002 of ispSTREAM file 1000 and downloaded through signal SDI into ISP PLDs 401, 402 and 403, by pulsing the SCLK signal 15 times. Next, at step 1506, the devices of serially connected chain 400 are placed into the "execute" state by Programming command generator 404, executing the signal protocol illustrated in FIG. 11. The bulk erase function is then executed at step 1507 by setting ispEN, SDI, SCLK and Mode signals logic low and then pulsing signal SCLK.

Figure 12:
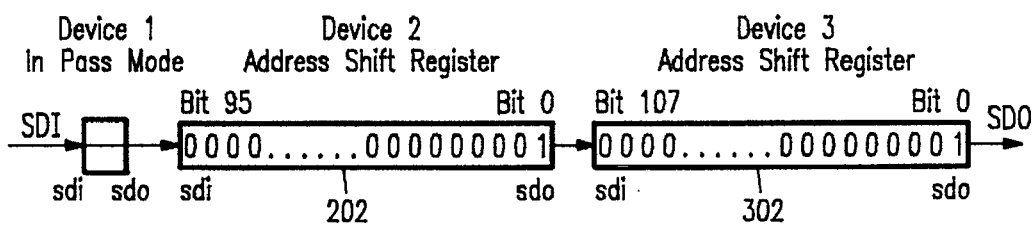
FIG. 12 is a schematic diagram showing address bits that are shifted into shift address registers 202 and 302.
Figure 18B:
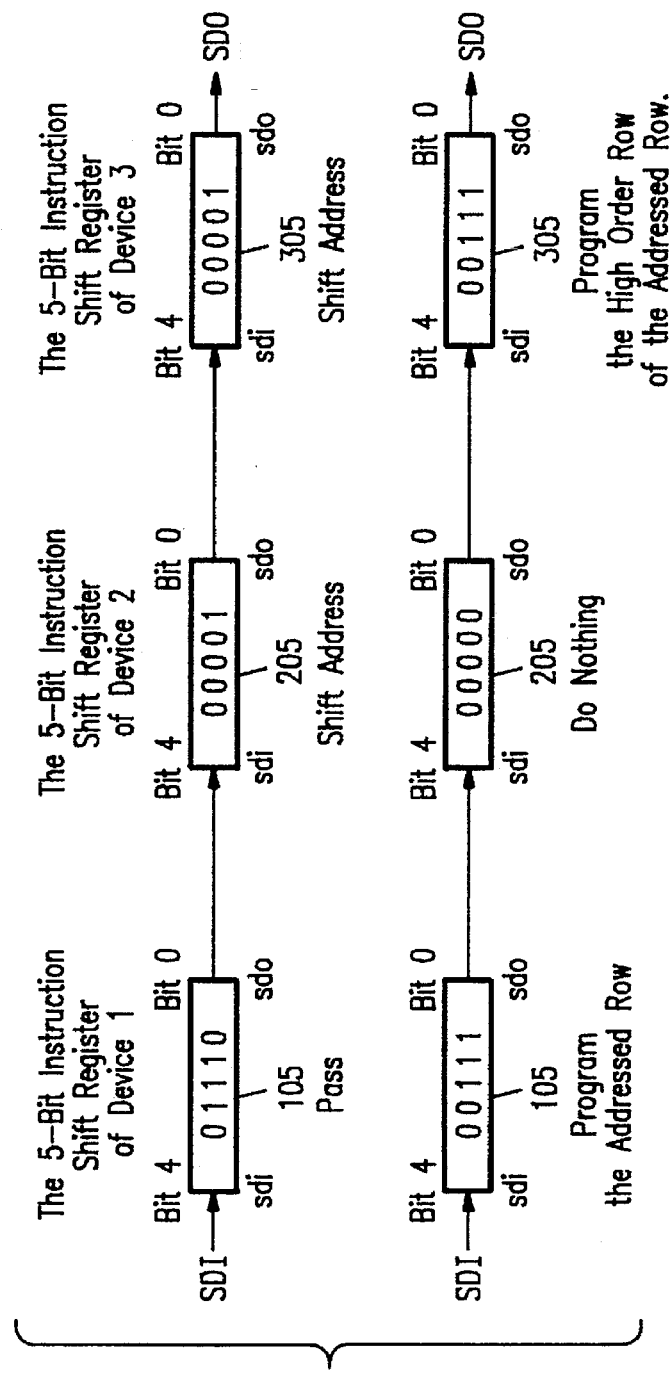
FIG. 18b shows the contents of 5-bit instruction registers 105, 205 and 305 of ISP PLDs 401–403, respectively, after the shift address instructions are downloaded at step 1510.

FIG. 5b shows portion 1500b of flow diagram 1500, which covers steps 1508-1515. Step 1508 is a waiting step to wait for the completion of the bulk erase instruction. Since ISP PLDs devices 401, 402 and 403 are bulk-erased simultaneously, waiting step 1508 is completed when bulk erase is completed in the device requiring the most time. At step 1509, ISP PLDs 401, 402 and 403 are placed again in "shift" state, in the manner described above, for receiving further instructions. At step 1510, the shift address instructions (i.e. the "ADDSHFT" instruction for each of ISP PLDs 402 and 403 and the "FLOWTHRU" instruction for ISP PLD 401, as discussed above) are then retrieved from data structure 1003 of ispSTREAM file 1000 and downloaded into ISP PLDs 401, 402 and 403. FIG. 18b shows the contents of 5-bits instruction registers 105, 205 and 305 of ISP PLDs 401-403, respectively, after the shift address instructions are downloaded. At step 1511, ISP PLDs 401, 402 and 403 are placed in the "execute" state in the manner described above. The addresses bits (204) are then retrieved, at step 1512, from data structure 1004 of ispSTREAM file 1000 and shifted into ISP PLDs 402 and 403, by pulsing the SCLK signal 204 times. FIG. 12 is a schematic diagram showing shifting address bits into shift address registers 202 and 302.

Figure 13:
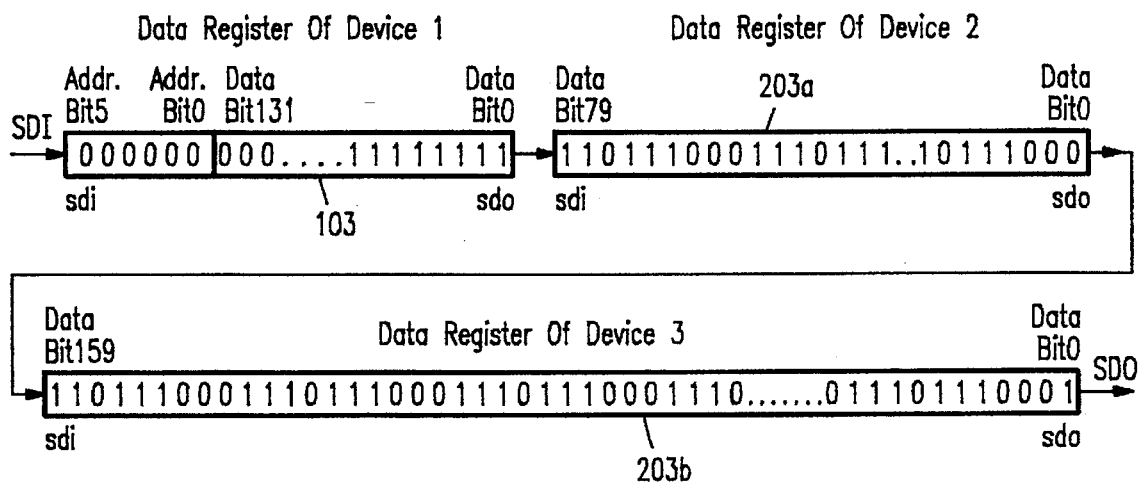
FIG. 13 shows the contents of data registers 103, 203a and 303a, after executing step 1516 illustrated in FIG. 15c.

At steps 1514-1516 (FIG. 15c), the shift data instruction and programming data bits are retrieved from data structures 1005 and 1006, and shifted into data registers 103, 203a and 303a of ISP PLDs 401, 402 and 403. Steps 1514-1516 perform, respectively, the functions of (i) placing ISP PLDs 401-403 in "shift" state, (ii) shifting in the data shift instructions of data structure 1005, (iii) placing ISP PLDs 401-403 in "execute" state, (iv) shifting the program data bits of data structure 1006 into data registers 103, 203a and 203b. FIG. 13 shows the contents of data registers 103, 203a and 303a, after the step 1516. ISP PLDs 401-403 are then placed in "shift" mode again to receive the program instructions. If the data shifted into data registers 103, 203a and 303a are all '1's, programming can be skipped. Thus, at step 1518, if the data in data registers 103, 203a and 303a are all '1's, the next step is step 1524 (FIG. 15c); otherwise, step 1519 retrieves from data structure 1007 of ispSTREAM file 1000 the program instructions for ISP PLDs 401-403. At step 1520, ISP PLDs 401-403 are then placed into the "execute" state, in the manner explained above. Programming is initiated at step 1521 by setting ispEN, MODE, SDI and SCLK signal to logic low and then pulsing the SCLK signal. State 1522 is a timing state, in which command generator 404 waits a predetermined required time period to ensure successful programming. Thus, simultaneous programming is achieved. ISP PLDs 401-403 are then returned to the shift state for receiving further instructions. FIG. 18c shows the contents of 5-bits instruction registers 105, 205 and 305 of ISP PLDs 401-403, respectively, after the shift address instructions are downloaded at step 1519. FIG. 18c also shows that, when the program bits in data register 203a is all '1's, but if neither data register 103 nor data register 303a is all '1's, then programming proceeds with ISP PLD 402's instruction register 205 set to a NOP (no operation) instruction. It is found that, with the sorting at step 1404 of programming data bits into the two groups, for an ispGAL22V10 type device, and three groups, for an ispLSI device, substantial programming time is saved because programming steps 1519-1523 can then be skipped.

Verify instructions are then retrieved from data structure 1008 of ispSTREAM file 100 and provided to ISP PLDs 401-403 at step 1524. At step 1525, ISP PLDs 401-403 are placed in the "execute" state. At step 1526, data verify operations are initiated by the protocol: (i) setting ispEN, SDI, SCK, and MODE signals to logic low and (ii) thereafter, the SCLK clock signal is pulsed. State 1527 then waits for a period sufficient for each ISP PLD device to read the memory for programmed data bits stored at steps 1519-1523. The data to be verified are then shifted out of data registers 103, 203a and 203b by (i) placing, at step 1528, ISP PLDs 401-403 into the "shift state; (ii) at step 1529, retrieving from data structure 1014 of ispSTREAM file 1000 the data shift instructions, and shifting such instructions into ISP PLDs 401-403; (iii) at step 1530, placing ISP PLDs 401-403 into the "execute" state, and (iv) at step 1531, pulsing signal SCLK 378 times to output at signal SDO, the data bits of data registers 103, 203a and 303a. If the data shifted out of ISP PLDs 401-403 are identical to the data in data structure 1006 of ispSTREAM file 1000, ISP PLDs 401-403 are properly programmed.

At step 1532 (FIG. 15e), ISP PLDs 401-403 are placed in the "shift" state to continue programming of ISP PLDs 401-403. Steps 1514-1532 are repeated to program the next row in ISP PLD 401, and the next half-row in each of ISP PLDs 402-403. Thereafter, at decision point 1534, isp-STREAM file 1000 is checked to determined all data in ispSTREAM file 1000 have been downloaded into the devices in serially connected chain 400. If there remains more data to download into ISP PLDs 401-403, procedure 1500 returns to step 1514; otherwise, procedure 1500 is completed.

The above detailed description is provided to illustrate specific embodiments of the present invention and is not intended to be limiting. Numerous variations and modifications within the scope of the present invention are possible. For example, as mentioned above, the present invention is applicable to all types of field programmable devices, including programmable logic devices, programmable memories, and programmable analog circuits. The present invention is set forth in the claims appended below.

/****************************************************************
 *                                                              *
 *                        DL_ZOOM.C                             *
 *                                                              *
 * This program contains the core functions needed to perform the *
 * daisy chain parallel programming.                            *
 *                                                              *
 *                                                              *
 * Rev   By            Date         Description                 *
 * ------------------------------------------------------------ *
 * 5.30  Howard Tang   11/09/94                                 *
 *                                                              *
 ****************************************************************/

```c
#include <stdio.h>
#include <conio.h>
#include <math.h>
#include <dos.h>
#include <alloc.h>
#include <process.h>
#include <stdlib.h>
#include <bios.h>
#include <direct.h>
#include <time.h>
#include <string.h>
include <ctype.h> include "dl_com.h"
include "dl_down.h"
#include "dl_dev.pro"

extern unsigned char *infile;
extern char    *pfuse;
extern int     inputport,
               outputport,
               port;
extern int     array_changed,
               file_sfuse,
               chip_sfuse;
extern int     file_valid,
               file_id,
               file_ok;

extern char    daisychain_chip[max_chips_in_daisychain];
extern char    write_ues_row;
/*added by ht to preserve the QP field when writing JEDEC file*/
extern int     qp;

unsigned int   *data_length;
unsigned char  **buffer;

typedef struct zoomcfg {
    char           name[max_name_len];
    char           op[5];
    int            opvalue;
    char           jedfile[pathmax];
    unsigned char  id;
    int            width;
    int            length;
    int            ues;              /* true if program ues */
    int            security;         /* true if security bit set */
}              ZOOMCFG;

ZOOMCFG        zoomconfg[max_chips_in_daisychain];
```

```
/* define 5-bit command codes, using 8-bit value, with the 3 MSBs zeroed */
define NOP                 0x00            /* 00000 - No operation */ define SHIFT_ADDRESS       0x01            /* 00001 - Enable address
                                             * shift register */
#define SHIFT_DATA          0x02            /* 00010 - Enable data shift
                                             * register    */
#define ARCH_SHIFT          0x14            /* 10100 - Enable arch shift
                                             * for 22v10   */ define ERASE               0x03            /* 00011 - Erase entire
                                             * device, except UES */
#define ERASE_ALL           0x10            /* 10000 - Erase entire
                                             * device, and UES    */ define PROGRAM_HIGH        0x07            /* 00111 - Program high order
                                             * bits        */
#define PROGRAM_LOW         0x08            /* 01000 - Program low order
                                             * bits        */
define PROGRAM_UES         0x0F            /* 01111 - Program UES row*/ define SECURE              0x09            /* 01001 - Program security
                                             * cell        */ define VERIFY_HIGH_PROG    0x0A            /* 01010 - Verify high order
                                             * bits are programmed (JEDEC
                                             * zeros)      */
#define VERIFY_LOW_PROG     0x0B            /* 01011 - Verify low order
                                             * bits are programmed (JEDEC
                                             * zeros)      */ define VERIFY_HIGH_ERASED  0x12            /* 10010 - Verify high order
                                             * bits are erased (JEDEC
                                             * ones)       */
#define VERIFY_LOW_ERASED   0x13            /* 10011 - Verify low order
                                             * bits are erased (JEDEC
                                             * ones)       */ define VERIFY_UES          0x11            /* 10001 - Verify/Load UES
                                             * bits        */ define FLOW_THRU           0x0E            /* 01110 - Put the device in
                                             * bypass mode */

/*Prototype of routines*/
void        dl_init_zoom();
int         dl_check_op(int devices_in_chain, int *operation);
int         dl_read_dldfile(char *infilename, int *longest_row,
                        int *devices_in_chain,
                        int *HD_devices, int *operation);
void        g22v10_bitmap(unsigned char *infile);
int         pack_jedec_files(char *infilename,
                        int *last_row, int *erase_pulse, int *program_pulse,
                        int *devices_in_chain, unsigned int *maxi_data);
int         ispstream_pump(int last_row, int erase_pulse,
                        int program_pulse,
                        int *devices_in_chain, unsigned int maxi_data);
extern int  read_jedec_file(FILE * fpr, unsigned char *infile, unsigned
                        long *nfuse);
extern int  num_daisychain_chips;
extern int  curr_chip;

/**************************************************************
 *                                                            *
```

```
/****************************************************************
 *                                                              *
 *                    DL_INIT_ZOOM                              *
 *                                                              *
 ****************************************************************/ void            dl_init_zoom()
{
   int          i;
   for (i = 0; i < max_chips_in_daisychain; i++) {
      zoomconfg[i].name[0] = '\0';
      zoomconfg[i].op[0] = '\0';
      zoomconfg[i].opvalue = -1;
      zoomconfg[i].jedfile[0] = '\0';
      zoomconfg[i].id = 0;
      zoomconfg[i].width = 0;
      zoomconfg[i].length = 0;
      zoomconfg[i].ues = 0;                 /* for HD devices only */
      zoomconfg[i].security = 0;
   }
}

/****************************************************************
 *                                                              *
 *                    DL_CHECK_OPERATION                        *
 *                                                              *
 * Zoom supports all verify or all program_verify. Mix          *
 * operation is not supported.                                  *
 ****************************************************************/ int             dl_check_op(int devices_in_chain, int *operation)
{
   int          i;

*operation = OP_NOP;
   for (i = 0; i <= devices_in_chain; i++) {
#ifdef EVAL
      printf("devices =%d i=%d,operation=%s,opvalue=%d\n",
             devices_in_chain, i, zoomconfg[i].op,
             zoomconfg[i].opvalue);
#endif
      if (!strncmpi(zoomconfg[i].op, "PV", 2)) {
         if (zoomconfg[i].jedfile[0] != '\0')    /* force to nop if no JEDEC
                                                  * file */
            zoomconfg[i].opvalue = OP_PROGRAM_VERIFY;
         else
            zoomconfg[i].opvalue = OP_NOP;
      } else if (!strncmpi(zoomconfg[i].op, "V", 1))
         zoomconfg[i].opvalue = OP_VERIFY;
      else if (!strncmpi(zoomconfg[i].op, "C", 1))
         zoomconfg[i].opvalue = -1;
      else if (!strncmpi(zoomconfg[i].op, "RS", 2))
         zoomconfg[i].opvalue = -1;
      else if (!strncmpi(zoomconfg[i].op, "E", 1))
         zoomconfg[i].opvalue = -1;
      else if (!strncmpi(zoomconfg[i].op, "NOP", 3))
         zoomconfg[i].opvalue = OP_NOP;
      else
         zoomconfg[i].opvalue = -1;
      if (zoomconfg[i].opvalue == -1) {
#ifdef EVAL
         printf("i=%d,operation=%s,opvalue=%d\n", i, zoomconfg[i].op,
                zoomconfg[i].opvalue);
#endif
         return UNKNOWN_FUNCTION;
```

```
    } else if (zoomconfg[i].opvalue != OP_NOP) {
        if (*operation == OP_NOP)
            *operation = zoomconfg[i].opvalue;
        else if (*operation != zoomconfg[i].opvalue) { /* mix operation
                                                        * supported */
            if ((*operation == OP_PROGRAM_VERIFY) ||
                (zoomconfg[i].opvalue == OP_PROGRAM_VERIFY))
                *operation = OP_PROGRAM_VERIFY;  /* keep the dominant
                                                    operation */
        }
    }
}
if (*operation == OP_NOP) {                  /* the file has NOP and
                                              * illegal operations */
#ifdef EVAL
    printf("i=%d,operation=%s,opvalue=%d\n", i, zoomconfg[i].op,
            zoomconfg[i].opvalue);
#endif
    return FILE_NOT_VALID;                   /* reject the file */
}
return OK;
}

/****************************************************************
*                                                                *
*                     DL_READ_DLDFILE                            *
*                                                                *
****************************************************************/ int         dl_read_dldfile(char *infilename, int *longest_row,
                            int *devices_in_chain,
                            int *HD_devices, int *operation)
{
    int         i,
                j,
                rcode,
                valid;
    char        str[chip_type_len],
                str1[chip_type_len],
                str2[chip_type_len];
    char        tstr[strmax];
    FILE        *fpr;

valid = false;
    *HD_devices = false;
    i = 0;
    *longest_row = 0;
    dl_init_zoom();
    *devices_in_chain = 0;

if ((fpr = fopen(infilename, "r")) == NULL)
        return FILE_NOT_FOUND;
    while (fgets(tstr, strmax, fpr) != NULL) {
        valid = false;
        if (sscanf(tstr, "%s%s%s", zoomconfg[i].name, zoomconfg[i].op,
                   zoomconfg[i].jedfile) > 0) {
#ifdef EVAL
            printf(".DLD file read i= %d %s %s %s\n", i, zoomconfg[i].name,
                    zoomconfg[i].op,
                    zoomconfg[i].jedfile);
#endif
            sprintf(str, "ispLSI%s", zoomconfg[i].name);
            sprintf(str1, "ispGAL%s", zoomconfg[i].name);
            sprintf(str2, "isp%s", zoomconfg[i].name);
```

```
/*  word1 = number of bits in the stream                          *
 *  Byte 0..x0 = id bit stream                                    *
 *  word2 = number of bits in the stream                          *
 *  Byte 0..x1 = command stream  i.e load address                 *
 *  word3 = number of bits in the stream                          *
 *  Byte 0..x2 = command stream  i.e load data                    *
 *  word4 = number of bits in the stream                          *
 *  Byte 0..x3 = command stream  i.e program                      *
 *  wordN = last word = file checksum                             *
 ******************************************************************/ int             pack_jedec_files(char *infilename,
                        int *last_row, int *erase_pulse, int *program_pulse,
                        int *devices_in_chain, unsigned int *maxi_data)
{
    int             rcode,
                    decval,
                    valid,
                    i,
                    j,
                    k;
    FILE            *fpr;
    FILE            *fpw;
    unsigned long   total_fuse = 0;
    unsigned long   total_memory;
    unsigned long   nfuse,
                    in_pos,
                    data_in_pos,
                    out_pos,
                    tmp;
    unsigned char   uch,
                    ch,
                    curch,
                    mask;
    unsigned long   *curr_pos;
    int             HD,
                    condition;
    int             HD_devices = 0;
    int             GAL_devices = 0;
    int             GDS_devices = 0;
    int             in_col,
                    data_in_col,
                    out_col,
                    address_bits,
                    address;
    int             operation,
                    maxi_row,
                    width,
                    ues_row,
                    sec_row,
                    row;
    int             ues,
                    data;
    unsigned int    m,
                    n;                          /* index of the memory
                                                   blocks */
    int             instruction_bit_length = 5; /* for all isp devices */
    int             isp_hw_id = 8;              /* hardwire id bit length */
    unsigned char   addressing[chip_max_address / 8 + 1];
    int             do_data,
                    do_command,
                    do_address,
                    do_ues,
                    do_security,
                    do_program,
                    do_verify;
```

```
unsigned char   instruction;
register int    l;
int             row_map[2 * chip_max_address + 1];

data_length = NULL;
buffer = NULL;
curr_pos = NULL;
*erase_pulse = 0;
*program_pulse = 0;
do_program = do_verify = false;
total_fuse = 0;
*last_row = 0;
valid = 0;
do_security = false;                        /* default to no security
                                             * programming */
rcode = OK;
rcode = dl_read_dldfile(infilename, &maxi_row, devices_in_chain,
                        &HD, &operation);
if (rcode != OK)
    return rcode;
if (operation == OP_PROGRAM_VERIFY)
    do_program = true;                      /* program & verify */
/* can also mix with verify only */
else if (operation == OP_VERIFY)
    do_verify = true;                       /* strictly verify only */ if ((curr_pos = (unsigned long *) calloc(18 * (maxi_row + 3),
     sizeof(unsigned long))) == NULL) {
    free(curr_pos);
    return FILE_TOO_BIG;
}
if ((data_length = (unsigned int *) calloc(18 * (maxi_row + 3),
     sizeof(unsigned int))) == NULL) {
    free(curr_pos);
    free(data_length);
    return FILE_TOO_BIG;
}

/*
 * build the data length per row matrix and assumming that the job on hand
 * is always programming and verification
 */
ues_row = ues = 0;
if (HD)
    data = instruction_bit_length;          /* for chains contain HD
                                             * devices */
else
    data = 0;                               /* for GAL only chain */
for (i = *devices_in_chain; i >= 0; i--) {

/*
     * look for the worst case bulk erase pulse width and programming pulse
     * width
     */
    if ((operation == OP_PROGRAM_VERIFY) &&
        (zoomconfg[i].opvalue == OP_PROGRAM_VERIFY)) {
        if (device_info[daisychain_chip[i]].bulk_erase_delay > *erase_pulse)
            *erase_pulse = device_info[daisychain_chip[i]].bulk_erase_delay;
        if (device_info[daisychain_chip[i]].program_delay > *program_pulse)
            *program_pulse = device_info[daisychain_chip[i]].program_delay;
    }
    row = 0;
    GDS_devices = GAL_devices = HD_devices = false;
    if ((zoomconfg[i].id == id_GDS14) || (zoomconfg[i].id == id_GDS18) ||
        (zoomconfg[i].id == id_GDS22))
```

```
            if (*devices_in_chain > max_chips_in_daisychain) {
                fclose(fpr);
                return FILE_TOO_BIG;
            }
            for (j = 0; j < max_devices; j++) {
                if ((!stricmp(str, device_info[j].name)) ||
                    (!stricmp(str1, device_info[j].name)) ||
                    (!stricmp(str2, device_info[j].name))) {
                    daisychain_chip[i] = j;          /* store the chip identifier*/
                    zoomconfg[i].id = device_info[j].id;
                    if ((zoomconfg[i].id == id_GDS14) ||
                        (zoomconfg[i].id == id_GDS18) ||
                        (zoomconfg[i].id == id_GDS22)) {
                        zoomconfg[i].width = 24;          /* Only for GDS */
                        zoomconfg[i].length = device_info[j].max_address
                            + device_info[j].arch_rows;
                    } else if (zoomconfg[i].id == id_GAL22v10) {
                        zoomconfg[i].width = 138;         /* Only for GAL22V10 */
                        /* add 1 to account for arch row and 1 for the security row */
                        zoomconfg[i].length = device_info[j].max_address + 1 + 1;
                    }
                    else { /* Only for HD */
                        zoomconfg[i].width = device_info[j].data_width;
                        /* ues row included */
                        zoomconfg[i].length = 2 * device_info[j].max_address;
                        *HD_devices = true;
                    }
                    valid = true;
                    break;
                }
            }
        }
        if (valid)
            *devices_in_chain = i++;
        else if (zoomconfg[i].name[0] == '\0') {
        }
        /* skip empty lines */
        else
            return UNKNOWN_CHIP;

}
    rcode = dl_check_op(*devices_in_chain, operation);
    if (rcode == OK) {
        for (i = 0; i <= *devices_in_chain; i++) {
            if (zoomconfg[i].opvalue == OP_NOP) {
                zoomconfg[i].width = 0;
                zoomconfg[i].length = 0;
            }
            if (zoomconfg[i].length > *longest_row)
                *longest_row = zoomconfg[i].length;
        }
    }
    fclose(fpr);
    return rcode;
}

/*****************************************************************
*                                                                *
*                        22v10_bitmap                            *
*                                                                *
*   bit             - internal bit location                      *
```

```
*                                                              *
*                                                              *
* This procedure maps a packed internal data bit location      *
* to a corresponding jedec fuse location.                      *
*                                                              *
****************************************************************/ void        g22v10_bitmap(unsigned char *infile)
{
   unsigned long   bit,
                   jed;
   int             in_col,
                   out_col;
   unsigned long   in_pos,
                   out_pos;
   unsigned char   buf[(jedec_bits_GAL22v10 + ues_bits_GAL22v10) / 8 + 1];

for (jed = 0; jed < jedec_bits_GAL22v10 + ues_bits_GAL22v10; jed++) {
      bit = jed;
      if (jed < ((unsigned long) max_address_GAL22v10
              * (unsigned long) data_width_GAL22v10)) { /* and array */
         bit = ((jed % (unsigned long) max_address_GAL22v10) *
                 (unsigned long) data_width_GAL22v10) +
              (jed / (unsigned long) max_address_GAL22v10);
      } else if (jed < ((unsigned long) max_address_GAL22v10
              * (unsigned long) data_width_GAL22v10
              + (unsigned long) glb_width_GAL22v10)) { /* architecture */
         /* unscramble architecture row */
         if (jed % 2) {
            bit = jed - 1;
         } else {
            bit = jed + 1;
         }
      }
      in_pos = jed / 8;
      in_col = (int) (7 - jed % 8);
      out_pos = bit / 8;
      out_col = (int) (7 - bit % 8);

if ((infile[in_pos] >> in_col) & 1)
         buf[out_pos] |= 1 << out_col;
      else
         buf[out_pos] &= ~(1 << out_col);
   }
   /* write back to infile */
   for (bit = 0; bit <= (jedec_bits_GAL22v10 + ues_bits_GAL22v10) / 8; bit++)
      infile[bit] = buf[bit];

}

/***************************************************************
*                                                              *
*                  PACK_JEDEC_FILES                            *
*                                                              *
* infilename        - .DLD file name                           *
* infile            - packed array to store jedec data         *
* display           - display data on screen                   *
*                                                              *
*                                                              *
* This procedure reads in the .DLD file and the JEDEC files    *
* to create the zoom file                                      *
*                                                              *
* The format of the zoom file:                                 *
* Byte 0 = 0f for isp, f0 for jtag                             *
* Byte 1 = devices in the chain                                *
```

```
         GDS_devices = true;
      else if (zoomconfg[i].id == id_GAL22v10)
         GAL_devices = true;
      else
         HD_devices = true;
      data_length[row++] += isp_hw_id;          /* keep id */
      if (do_program)                           /* applicable to program and
                                                 * verify operation only */
         data_length[row++] += instruction_bit_length;  /* Bulk Erase */
      else
         row++;
      for (j = 0; j <= maxi_row; j++) {
         if (j % 2) {                           /* odd or even row? */
         }
          /* odd row, no address shift */
         else {                                 /* even row */
            if (j == maxi_row)
               row++;                           /* no address shift for ues
                                                 * row */
            else
               data_length[row++] += data;      /* address shift in */
            if ((HD_devices) && (j < zoomconfg[i].length) &&
                (zoomconfg[i].opvalue != OP_NOP))
               data_length[row++]
                  += device_info[daisychain_chip[i]].address_bits;
            else
               row++;                           /* not applicable to gds &
                                                 * 22v10 */
         }
         if (do_verify) {
            row++;
            row++;
         }
          /* no verify erase */
         else if (j == maxi_row) {
            row++;
            row++;
         }
          /* skip it for ues row */
         else {
            data_length[row++] += data;         /* do verify Hvt */
            data_length[row++] += data;         /* data_shift_out */
         }
         row++;                                 /* dummy row, data_length[row]
                                                 * will contain # of 1s to
                                                 * verify */
         data_length[row++] += instruction_bit_length;  /* data_shift_in */

/* calculate the array bit lengths */
         if ((j <= zoomconfg[i].length) && (zoomconfg[i].opvalue != OP_NOP)) {
            if ((GAL_devices) && (j >= max_address_GAL22v10)) {
               if (j == max_address_GAL22v10)
                  data_length[row++] += glb_width_GAL22v10; /* arch row of
                                                             * GAL22v10 */
               else if ((j == zoomconfg[i].length - 1)  /* the ues row and
                                                         * security row */
                        ||(j == zoomconfg[i].length)) {
                  if (zoomconfg[i].opvalue == OP_VERIFY)
                     data_length[row++] += 0;   /* don't verify ues */
                  else
                     data_length[row++] += zoomconfg[i].width;
               }
            } else if ((j == zoomconfg[i].length) && (HD_devices)) {
               if ((do_program) && (zoomconfg[i].opvalue == OP_PROGRAM_VERIFY))
                  ues += zoomconfg[i].width;    /* pack all UES at the last
                                                 * row */
```

```
                    if (j == maxi_row)
                        ues_row = row;              /* the ues_row is found */
                    row++;
                } else
                    data_length[row++] += zoomconfg[i].width;
            } else
                row++;                              /* array = 0 */
            if (do_program)
                data_length[row++] += instruction_bit_length;   /* Program */
            else
                row++;                              /* skip if verify only */
            data_length[row++] += instruction_bit_length;   /* Verify Lvt */
            data_length[row++] += instruction_bit_length;   /* data_shift out */
        }
        data_length[row++] += instruction_bit_length;   /* secure */
        if (row - 1 > *last_row)
            *last_row = row - 1;
    } if ((HD) && (do_program)) {
        data_length[ues_row] += ues;            /* the chain contain HD
                                                 * devices and assume all */
        data_length[ues_row - 4] = 0;           /* no verify erase instruction
                                                 * needed */
        data_length[ues_row - 3] = 0;           /* no data shift */
        data_length[ues_row - 2] = 0;           /* no erased bit counts */
    } else if ((HD) && (do_verify) && (ues_row)) {/* ues row exist ? */
        data_length[ues_row] = 0;               /* reserve no room for ues
                                                 * bits */
        data_length[ues_row - 4] = 0;           /* no verify erase instruction
                                                 * needed */
        data_length[ues_row - 3] = 0;           /* no data shift */
        data_length[ues_row - 2] = 0;           /* no erased bit counts */
        data_length[ues_row - 1] = 0;           /* no data shift */
        data_length[ues_row + 1] = 0;           /* no action on program */
        data_length[ues_row + 2] = 0;           /* no action on verify */
        data_length[ues_row + 3] = 0;           /* no action on data_shift */
    }
    *maxi_data = data_length[0];
    for (i = 0; i <= *last_row; i++) {
        curr_pos[i + 1] = curr_pos[i] + (unsigned long) data_length[i];
        total_fuse += (unsigned long) data_length[i];
        if (*maxi_data < data_length[i])
            *maxi_data = data_length[i];
    } total_memory = total_fuse / 8 + 2;
    m = total_memory / 0xFFF0;

if ((buffer = (unsigned char **) calloc(m + 2,
                sizeof(unsigned char *))) == NULL) {
        free(curr_pos);
        free(data_length);
        free(buffer);
        return FILE_TOO_BIG;
    }
    for (i = 0; i < m + 2; i++)
        buffer[i] = NULL;                       /* initialize the array */
    i = 0;
    do {
        if ((buffer[i++] = (unsigned char *) calloc(0xFFF0,
            sizeof(unsigned char))) == NULL) {
            free(curr_pos);
            free(data_length);
            for (j = 0; j < i; j++)
```

```
            if (buffer[j] != NULL)
               free(buffer[j]);
/*                      free(*buffer);   */
         free(buffer);
         return FILE_TOO_BIG;
      }
   } while (i <= m);

/*
    * build the combined pack file first so that all the variables in the
    * zoomconfg struct are filled
    */ for (i = *devices_in_chain; i >= 0; i--) {
      for (j = 0; j <= 2 * chip_max_address + 1; j++)
         row_map[j] = j;                        /* initialize the row_map */
      if ((zoomconfg[i].opvalue == OP_NOP) || (zoomconfg[i].jedfile == '\0'))
         zoomconfg[i].opvalue = OP_NOP;         /* no need to read the jedec
                                                 * file */
      else {
         rcode = FILE_NOT_VALID;
         if ((fpr = fopen(zoomconfg[i].jedfile, "r")) == NULL)
            return FILE_NOT_FOUND;
         ch = fgetc(fpr);
         while ((isjedec(ch)) && (ch != jedec_stx))
            ch = fgetc(fpr);
         if (ch == jedec_stx) {                 /* standard jedec file
                                                   format */
            rcode = read_jedec_file(fpr, infile, &nfuse);
         }
         if (rcode != OK)
            return rcode;
         /* check if the fuse count matches with the device selected */
         if ((nfuse !=    /* HD,GDS devices   ?? */
             (unsigned long) (device_info[daisychain_chip[i]].jedec_bits))
             &&(nfuse != (device_info[daisychain_chip[i]].jedec_bits +
                          device_info[daisychain_chip[i]].ues_bits))) {
            return FILE_ERROR;
         }
         GDS_devices = GAL_devices = HD_devices = false;
         if ((zoomconfg[i].id == id_GDS14) || (zoomconfg[i].id == id_GDS18) ||
             (zoomconfg[i].id == id_GDS22))
            GDS_devices = true;
         else if (zoomconfg[i].id == id_GAL22v10)
            GAL_devices = true;
         else
            HD_devices = true;
         if (write_ues_row)
            zoomconfg[i].ues = true;
         if ((HD_devices) && (!write_ues_row) &&
             (zoomconfg[i].opvalue == OP_PROGRAM_VERIFY))
            data_length[ues_row] -= zoomconfg[i].width; /* adjust the ues
                                                           length */
         if (file_sfuse) {
            zoomconfg[i].security = true;
            if (HD_devices)
               do_security = true;              /* HD security fuse
                                                 * programming required */
         }
         if (GAL_devices)
            g22v10_bitmap(infile);

/* group all the all 1 rows together to minimize programming time */
         if ((HD_devices) &&
             (zoomconfg[i].opvalue == OP_PROGRAM_VERIFY)) { /* programming time
                                                             * minimization for
```

```
            valid = true;                    /* all 1 even row? */
            data = true;                     /* all 1 odd row? */
            in_col = 0;                      /* keep track of the num of
                                              * all 1s even & odd rows */
            n = 0;                           /* keep track of the number of
                                              * relocation */
         data_in_pos = 0;
         data_in_col = 8;
         curch = infile[data_in_pos];
         for (j = 0; j < zoomconfg[i].length; j++) {
            /* leave ues row alone */
            for (k = 0; k < zoomconfg[i].width; k++) {
               --data_in_col;
               if (data_in_col < 0) {
                  data_in_col = 7;
                  data_in_pos++;
                  curch = infile[data_in_pos];
               }
               if (!((curch >> data_in_col) & 1)) {   /* see a 0? */
                  if (j % 2)                   /* odd rows? */
                     data = false;             /* odd row not all 1s */
                  else
                     valid = false;            /* even row not all 1s */
               }
            }
            if (j % 2) {                       /* odd rows? */
               if ((data) && (valid)) {        /* both odd & even are 1s */
                  for (m = j - 2 * n - 1;
                       m < zoomconfg[i].length - 2; m++) {
                     row_map[m] = row_map[m + 2];    /* move the row up
                                                         by 2 */
                  }
                  /* map the current 2 rows to the vacated rows */
                  row_map[zoomconfg[i].length - 2] = j - 1;
                  row_map[zoomconfg[i].length - 1] = j;
                  in_col++;                    /* mark the insertion done */
                  n++;                         /* keep the relocation
                                                  count */
               } else if ((data) || (valid)) {
                  /* leave the odd and even rows all 1s at the bottom */
                  for (m = j - 2 * n - 1;
                       m < zoomconfg[i].length - 2 * in_col - 2; m++) {
                     row_map[m] = row_map[m + 2];
                  }
                  if (data) {                  /* only the odd row is all
                                                  1s */
                     row_map[zoomconfg[i].length - 2 * in_col - 2] = j - 1;
                     row_map[zoomconfg[i].length - 2 * in_col - 1] = j;
                     n++;                      /* increase the relocation
                                                * count */
                  } else if (valid) {          /* only the even row is all
                                                * 1s make the all 1 row
                                                * last */
                     row_map[zoomconfg[i].length - 2 * in_col - 2] = j;
                     row_map[zoomconfg[i].length - 2 * in_col - 1] = j - 1;
                     n++;                      /* increase the relocation
                                                * count */
                  }
               }
               valid = data = true;            /* reset them for the next
                                                * odd/even pair of rows */
            }
         }
      }
   }
}
```

```
#ifdef EVAL
      for (k = 0; k <= maxi_row; k++)
         printf("k = %d row_map[k] = %d\n", k, row_map[k]);
endif data_in_pos = 0;
      data_in_col = 8;
      curch = 0;
      uch = 0;
      j = 0;                                      /* device row */
      do_ues = false;                             /* do ues when reach the last
                                                   * row */
      row = 0;
      for (l = 0; l <= *last_row; l++) {
         do_address = false;
         do_data = false;
         do_command = false;
         address_bits = 0;
         if ((HD_devices) && (j == maxi_row) && (zoomconfg[i].ues)
             && (zoomconfg[i].opvalue == OP_PROGRAM_VERIFY)) {
            do_ues = true;                        /* reach the last row, go do
                                                   * ues */
            /* different in length in ues for 3256 and 8192 */
            data = zoomconfg[i].width
                 - device_info[daisychain_chip[i]].ues_bits;
         }
         if (l == 0) {                            /* id chains */
            width = isp_hw_id;
            addressing[0] = 0x00;                 /* borrow it to carry id */
            for (k = 0; k < isp_hw_id; k++)       /* rotate the id */
               if ((zoomconfg[i].id >> k) & 0x01)
                  addressing[0] |= 0x01 << 7 - k;
            do_address = true;
         } else if (l == 1) {                     /* Bulk erase instruction */
            if ((HD_devices) && (zoomconfg[i].ues))
               instruction = ERASE_ALL;
            else
               instruction = ERASE;
            width = instruction_bit_length;
            if (zoomconfg[i].opvalue != OP_PROGRAM_VERIFY)
               instruction = NOP;
            do_command = true;
            if (do_verify)
               width = 0;                         /* verify only so do
                                                     nothing */
         } else {
            if (l == *last_row)
               condition = 18;                    /* security fuse row */
            else
               condition = (l - 2) % 18;
            switch (condition) {
               case 0:
                  if ((HD_devices) &&
                      (zoomconfg[i].opvalue == OP_PROGRAM_VERIFY) &&
                      (j < zoomconfg[i].length)) {
                     /* search for the proper place to store the bits */
                     for (k = 0; k <= zoomconfg[i].length; k++)
                        if (j == row_map[k])
                           break;
                     if (k % 2)
                        row = (k - 1) * 9 + 2;    /* odd and even swap? */
                     else
                        row = k * 9 + 2;
                  } else
                     row = 1;
                  width = instruction_bit_length;
```

```
                if ((HD_devices) && (zoomconfg[i].opvalue != OP_NOP)
                    && (j < zoomconfg[i].length))
                    instruction = SHIFT_ADDRESS;
                else
                    instruction = FLOW_THRU;    /* not for GAL & GDS, NOP */
                do_command = true;              /* and defer ues row */
                break;
            case 1:
                if ((HD_devices) && (zoomconfg[i].opvalue != OP_NOP)
                    && (j < zoomconfg[i].length)) {
                    for (k = 0; k < chip_max_address / 8 + 1; k++)
                        addressing[k] = 0x00;
                    /* when j = 0,2,4,6 etc HD row = 0,1,2,3 etc */
                    addressing[j / 16] = 0x01 << (7 - (j / 2) % 8);
                    width = device_info[daisychain_chip[i]].address_bits;
                } else
                    width = 0;                  /* not for GAL & GDS */
                do_address = true;
                break;
            case 2:                             /* verify even row Hvt for HD
                                                 * devices only */
            case 10:                            /* verify odd row Hvt for HD
                                                 * devices only */
                width = instruction_bit_length;
                if ((HD_devices) &&
                    (zoomconfg[i].opvalue == OP_PROGRAM_VERIFY) &&
                    (j < zoomconfg[i].length)) {
                    for (k = 0; k < zoomconfg[i].length; k++)
                        if (j == row_map[k])
                            break;
                    if (condition == 10) {      /* odd rows */
                        if (k % 2) {            /* swap odd and even? */
                        }
                        /* odd row expected */
                        else {                  /* found even row */
                            row = k * 9 + 2 + 2; /* point to verify even row */
                        }
                        instruction = VERIFY_LOW_ERASED;
                    } else {                    /* even rows */
                        if (k % 2) {            /* even row expected but
                                                 * found odd row */
                            row = (k - 1) * 9 + 2 + 10; /* point to verify odd
                                                         * row */
                        }
                        instruction = VERIFY_HIGH_ERASED;  /* verify HD only
                                                            * first */
                    }
                } else
                    instruction = NOP;
                if ((HD_devices) && (j >= zoomconfg[i].length))
                    instruction = NOP;          /* no verify Hvt for ues */
                if (data_length[row] == 0) {
                    width = 0;
                    break;
                }                               /* do nothing */
                do_command = true;
#ifdef EVAL
                printf("l= %04d last_row = %04d device length = %03d
                        j = %03d k = %03d row = %04d\n",
                        l, *last_row, zoomconfg[i].length, j, k, row);
#endif
                break;
            case 3:                             /* shift out data to verify
                                                 * even row Hvt for HD
                                                 * devices */
            case 11:                            /* shift out data to verify
```

```
                                         * odd row Hvt for HD devices
                                         */
        width = instruction_bit_length;
        if (data_length[row] == 0) {
           width = 0;
           break;
        }
         /* do nothing */
        else if ((HD_devices) &&
                (zoomconfg[i].opvalue == OP_PROGRAM_VERIFY))
           instruction = SHIFT_DATA;
        else
           instruction = FLOW_THRU;
        if ((HD_devices) && (j >= zoomconfg[i].length))
           instruction = FLOW_THRU;    /* defer ues row */
        do_command = true;
        break;
case 4:                              /* calculate the number of 1s
                                      * to be shifted out */
case 12:                             /* to verify that the HD
                                      * devices is erased */
   width = 0;                        /* do not store the stream of
                                      * 1s to save memory */
   if (data_length[row - 1] == 0)
       break;                        /* do nothing */
   else if (instruction == SHIFT_DATA)  /* need to shift bits
                                         * out */
       data_length[row] += zoomconfg[i].width;
   break;
case 5:                              /* shift in data for
                                      * programming */
case 9:                              /* shift out data to verify
                                      * all devices */
case 13:                             /* shift in data for
                                      * programming */
case 17:                             /* shift out data to verify
                                      * all devices */
   width = instruction_bit_length;
   if (zoomconfg[i].opvalue != OP_NOP) {
       if ((GAL_devices) && (j >= max_address_GAL22v10)) {
           if (j == max_address_GAL22v10)
               instruction = ARCH_SHIFT;
           else if ((j == zoomconfg[i].length - 1) /* ues row and
                                                    * security
                                                    * row */
                   ||(j == zoomconfg[i].length)) {
               if (zoomconfg[i].opvalue == OP_VERIFY)
                   instruction = FLOW_THRU;
               else
                   instruction = SHIFT_DATA;
           } else
               instruction = FLOW_THRU;
       } else if ((HD_devices) && (j >= zoomconfg[i].length))
           instruction = FLOW_THRU; /* defer ues row */
       else if ((!HD_devices) && (j > zoomconfg[i].length))
           instruction = FLOW_THRU;
       else
           instruction = SHIFT_DATA;

} else
       instruction = FLOW_THRU;     /* for NOP */
   do_command = true;
   if (do_ues)
       instruction = SHIFT_DATA;    /* for HD devices only */
   if ((condition == 9) || (condition == 17))
       j++;                         /* point to next devices
```

```
        break;                              row */
    case 6:                                 /* pack data for even row of
                                             * HD devices */
    case 14:                                /* data for odd row of HD
                                             * devices */
        do_data = true;
        if ((zoomconfg[i].opvalue != OP_NOP) &&
            (j <= zoomconfg[i].length)) {
            if ((GAL_devices) && (j >= max_address_GAL22v10)) {
                if (j == max_address_GAL22v10)
                    width = glb_width_GAL22v10;
                else if ((j == zoomconfg[i].length - 1) ||
                         (j == zoomconfg[i].length)) {
                    if (zoomconfg[i].opvalue == OP_VERIFY)
                        width = 0;
                    else
                        width = zoomconfg[i].width;
                }
            } else
                width = zoomconfg[i].width;
        } else
            width = 0;
        if ((HD_devices) && (j >= zoomconfg[i].length))
            /* defer ues later */
            width = 0;
        if (do_ues)
            width = zoomconfg[i].width; /* ues length */
        break;
    case 7:                                 /* program command */
    case 15:
        width = instruction_bit_length;
        if ((zoomconfg[i].opvalue == OP_PROGRAM_VERIFY) &&
            (j <= zoomconfg[i].length)) { if ((HD_devices) && (condition == 15))
                instruction = PROGRAM_LOW;  /* program odd row of HD
                                             * devices */
            else if ((GAL_devices) && (j == zoomconfg[i].length)
                     && (!zoomconfg[i].security))
                                            /* program security ? */
                instruction = NOP;          /* don't program security */
            else
                instruction = PROGRAM_HIGH; /* program all */
        } else
            instruction = NOP;
        if ((HD_devices) && (j >= zoomconfg[i].length))
            instruction = NOP;              /* defer ues row */
        if (do_ues) {
            if (zoomconfg[i].opvalue == OP_PROGRAM_VERIFY)
                instruction = PROGRAM_UES;  /* for HD devices only */
            else
                instruction = NOP;
        }
        do_command = true;
        break;
    case 8:                                 /* verify command for all
                                             * devices in the chain */
    case 16:
        width = instruction_bit_length;
        if ((zoomconfg[i].opvalue != OP_NOP) &&
            (j <= zoomconfg[i].length)) {
            if ((condition == 16) && (HD_devices))
                instruction = VERIFY_LOW_PROG;
            else if ((GAL_devices) && (j == zoomconfg[i].length))
                instruction = NOP;          /* security row of GAL22v10 */
```

```
                    else
                        instruction = VERIFY_HIGH_PROG; /* verify all */
                } else
                    instruction = NOP;
                if ((HD_devices) && (j >= zoomconfg[i].length))
                    instruction = NOP;         /* defer ues row */
                if (do_ues)
                    instruction = VERIFY_UES;  /* for HD devices only */
                do_command = true;
                break;
            case 18:                              /* take care of programming
                                                   * security fuses for HD
                                                   * devices */
                if ((HD_devices) &&
                    (zoomconfg[i].opvalue == OP_PROGRAM_VERIFY) &&
                    (zoomconfg[i].security))
                    instruction = SECURE;
                else
                    instruction = NOP;
                width = instruction_bit_length;
                do_command = true;
                if (do_verify)
                    width = 0;                 /* verify only so do
                                                  nothing */
                break;
            case 19:
            default:
                width = 0;                     /* take care of do nothing
                                                  row */
                break;
        }
    }
    /* calculate the array bit lengths */
    m = (curr_pos[row] / 8) / 0xFFF0;
    n = (curr_pos[row] / 8) % 0xFFF0;
    out_col = 7 - (int) (curr_pos[row] % 8) + 1;
    uch = buffer[m][n];
    if (do_command) {

/*
         * rotate the instruction so that least significant bit shift in
         * first
         */
        curch = 0;
        for (k = 0; k < 8; k++)
            if ((instruction >> k) & 0x01)
                curch |= 0x01 << 7 - k;
        in_col = 8;
        in_pos = 0;
    } else if (do_address) {
        in_pos = 0;
        in_col = 8;
        curch = addressing[in_pos];
    } else if (do_data)
        curch = infile[data_in_pos];
    if (data_length[row] == 0)
        width = 0;
    else
        for (k = 0; k < width; k++) {
            if (do_data)
                data_in_col--;
            else
                in_col--;
            out_col--;
            if ((do_data) && (data_in_col < 0)) {
                data_in_col = 7;
```

```
         data_in_pos++;
         curch = infile[data_in_pos];
      } else if ((do_address) && (in_col < 0)) {
         in_col = 7;
         in_pos++;
         curch = addressing[in_pos];
      } else if ((do_command) && (in_col < 0))
         break;                           /* something wrong */ if (out_col < 0) {
         out_col = 7;
         buffer[m][n++] = uch;
         if (n >= 0xFFF0) {
            m++;
            n = 0;
         }
         uch = buffer[m][n];
      }
      if ((do_data) && (GDS_devices)) {
         if (((k <= 4) && (j <= 10)) ||
             ((k >= 16) && (k <= 17) && (j <= 12))) {
            uch |= 0x01 << out_col;       /* fill 5 lead, 2 trail dummy
                                           * bits */
            data_in_col++;
         } else if ((k >= 18) && (k <= 21) && (j <= 12)) {
            if ((j >> address_bits++) & 1)
               uch |= 0x01 << out_col;
            data_in_col++;
         } else if ((k >= 22) && (j <= 11)) {
            data_in_col++;                /* fill last trailing 0 */
         } else if ((k >= 22) && (j >= 12)) {
            if (((j - 12) >> address_bits++) & 1)
               uch |= 1 << out_col;
            data_in_col++;
         } else {
            if ((curch >> data_in_col) & 1)
               uch |= 1 << out_col;
         }
      } else if ((do_data) && (GAL_devices)) {
         if (j == max_address_GAL22v10) { /* arch row */
            if ((curch >> data_in_col) & 1)
               uch |= 1 << out_col;
         } else if (j == max_address_GAL22v10 + 1) {    /* ues row */
            if ((k > 63) && (k < 132)) {
               uch |= 1 << out_col;       /* fill unused ues bits
                                             with 1 */
               data_in_col++;
            } else if (k > 131) {
               if ((max_address_GAL22v10 >> address_bits++) & 1)
                  uch |= 1 << out_col;    /* ues address */
               data_in_col++;
            } else {
               if ((curch >> data_in_col) & 1)
                  uch |= 1 << out_col;    /* ues data */
            }
         }
         /* complete ues row */
         else if (j == zoomconfg[i].length) {   /* security row */
            if (k < 132) {
               uch |= 1 << out_col;       /* fill the row with 1 */
               data_in_col++;
            } else if (k > 131) {
               if ((61 >> address_bits++) & 1)
                  uch |= 1 << out_col;    /* security row address */
               data_in_col++;
            }
```

```
                            }
                            /* complete security row */
                        else {                              /* and arrary rows */
                            if (k >= 132) {                 /* generate address */
                                if ((j >> address_bits++) & 1)
                                    uch |= 1 << out_col;
                                data_in_col++;
                            } else {
                                if ((curch >> data_in_col) & 1)
                                    uch |= 1 << out_col;
                            }
                        }

} else if ((do_data) && (HD_devices)) {
                        /* Must be HD devices */
                        if (do_ues) {
                            /* take care of devices with
                             * UES bit ues length shorter than row length i.e
                             * 8192 and 3256 */
                            if ((data) && (k < data)) {
                                uch |= 0x01 << out_col;    /* fill in dummy 1s */
                                data_in_col++;
                            } else {
                                if ((curch >> data_in_col) & 0x01)
                                    uch |= 0x01 << out_col;
                            }
                        } else {                            /* non ues rows */
                            if ((curch >> data_in_col) & 0x01)
                                uch |= 0x01 << out_col;
                        }

} else {                                /* to shift in address or
                                                             * command */
                        if ((curch >> in_col) & 0x01)
                            uch |= 0x01 << out_col;
                    }
                }
                buffer[m][n] = uch;                         /* save the last byte
                                                             * ,complete or not */
            curr_pos[row] += width;
#ifdef EVAL
            if (do_command)
                printf("row = %04d condition = %02d j=%03d intstruction = %x\n",
                    row, condition, j, instruction);
endif row++;                                          /* ready for next row */
        }

} if ((!do_security) || (do_verify)) {                    /* do security? */
        curr_pos[*last_row] -= data_length[*last_row];
        data_length[*last_row] = 0;                         /* convert the row to do
                                                             * nothing */
    }
    if ((HD) && (ues > data_length[ues_row])) {
        /* less ues bits than reserved for shift out the excess bits */
        ues -= data_length[ues_row];                        /* # of excess bits */
        i = (int) (((curr_pos[ues_row] + ues) / 8) / 0xFFF0); /* mem block of
                                                             * end of
                                                             * ues string */
        /* mem byte of end of ues string */
        m = (unsigned int) (((curr_pos[ues_row] + ues) / 8) % 0xFFF0);
        /* bit position of last ues bit */
        in_col = 8 - (int) ((curr_pos[ues_row] + ues) % 8);
```

```c
        /* end of ues bit to end of ispSTREAM file */
        width = (int) (curr_pos[*last_row] - (curr_pos[ues_row] + ues));
        j = (int) ((curr_pos[ues_row] / 8) / 0xFFF0);  /* mem block of the new end
                                                        * of ues */
        /* mem byte of the new end of ues */
        n = (unsigned int) ((curr_pos[ues_row] / 8) % 0xFFF0);
        out_col = 8 - (int) (curr_pos[ues_row] % 8);
        uch = buffer[j][n];
        curch = buffer[i][m];
        for (k = 0; k < width; k++) {
           in_col--;
           out_col--;
           if (in_col < 0) {
              in_col = 7;
              m++;
              if (m >= 0xFFF0) {
                 i++;
                 m = 0;
              }
              curch = buffer[i][m];
           }
           if (out_col < 0) {
              out_col = 7;
              buffer[j][n++] = uch;
              if (n >= 0xFFF0) {
                 j++;
                 n = 0;
              }
              uch = 0;
           }
           if ((curch >> in_col) & 0x01)
              uch |= 0x01 << out_col;
           else
              uch &= ~(0x01 << out_col);
        }
        buffer[j][n] = uch;                      /* save the last byte
                                                  * ,complete or not */
     }
#ifdef EVAL
     data_in_col = 8;
     fpw = fopen("zoom.tst", "w");
     for (i = 0; i <= *last_row; i++)
        fprintf(fpw, " row = %3d %u\n", i, data_length[i]);
     out_col = 0;
     in_pos = 0;
     m = 0;
     n = 0;
     curch = buffer[m][n];
     address = 0;
     if ((data_length[address] % 8) > 0)
        in_col = true;
     else
        in_col = false;
     fprintf(fpw, "%03d ", address);
     while (address <= *last_row) {
        if (address > 1) {
           condition = (address - 2) % 18;
           if ((condition == 4) || (condition == 12)) {
              address++;
              fprintf(fpw, "bit length = %d \n%03d ",
                 data_length[address - 1], address);
           }
        }
        if (data_length[address] == 0) {
           address++;
           fprintf(fpw, "\n%03d ", address);
```

```
            out_col = 0;
      } else {
         for (j = 0; j < data_length[address]; j++) {
            --data_in_col;
            if (data_in_col < 0) {
               data_in_col = 7;
               n++;
               if (n >= 0xFFF0) {
                  m++;
                  n = 0;
               }
               curch = buffer[m][n];
            }
            if ((curch >> data_in_col) & 01)
               fputc('1', fpw);
            else
               fputc('0', fpw);
         }
      }
      address++;
      fprintf(fpw, "\n%03d ", address);
   }
   fclose(fpw);
#endif
   free(curr_pos);
   return rcode;
}

/***************************************************************
*                                                               *
*                    ISPSTREAM_PUMP                             *
*                                                               *
***************************************************************/ int             ispstream_pump(
                        int last_row, int erase_pulse, int program_pulse,
                        int *devices_in_chain, unsigned int maxi_data)
{
   unsigned int    m,
                   n,
                   error,
                   length,
                   index;
   int             rcode,
                   i,
                   j,
                   k,
                   out_pos,
                   out_col,
                   in_col;
   unsigned char   *data,
                   curch,
                   sdo,
                   cur_bit;
   char            do_shift_instruction,
                   condition,
                   shiftstate,
                   allzero;
   char            do_program,
                   do_erase,
                   do_shift_in_data,
                   do_shift_out_data;
   unsigned int    bit_1_count;
   register int    row;
   register unsigned char port_bit;
```

```
      port_bit = NUL;
      m = n = 0;
      rcode = OK;
      shiftstate = true;
      allzero = true;
      if ((data = (unsigned char *) (malloc(maxi_data / 8 + 1))) == NULL) {
         free(data);
         return ABORT;
      }
      /* establish parallel port communication */
      /* begin of codes which can be excluded from ispCODE/ispTEST */ find_port();
      rcode = get_daisychain_elements(false);
      if (rcode != OK) {
         return (rcode);
      }
/*check for isp parts*/
      if ((*devices_in_chain != num_daisychain_chips - 1)
          || (*devices_in_chain > max_chips_in_daisychain))
         return TOO_MANY_CHIPS;

for (i = 0; i < num_daisychain_chips; i++) {
         curr_chip = i + 1;
         if (!is_part_isp())
            return NON_ISP_PART;
      }
/*end of exception code*/ move_to_id_state();                          /* move to idle state */ error = 0;
      curch = buffer[m][n];
      in_col = 8;
      for (row = 0; row <= last_row; row++) {
#ifdef EVAL
         printf("\n");
#endif
         do_program = false;
         do_erase = false;
         do_shift_instruction = false;
         do_shift_in_data = false;
         do_shift_out_data = false;
         if (row == 0) {                           /* id chains */
            length = data_length[row];
            do_shift_out_data = true;
            out_pos = 0;
            out_col = 8;
            data[out_pos] = 0x00;
            for (index = 0; index < data_length[row]; index++) {
               --out_col;
               --in_col;
               if (out_col < 0) {
                  out_col = 7;
                  out_pos++;
                  data[out_pos] = 0x00;
               }
               if (in_col < 0) {
                  in_col = 7;
                  n++;
                  if (n >= 0xFFF0) {
                     m++;
                     n = 0;
                  }
```

```
                curch = buffer[m][n];
            }
            if ((curch >> in_col) & 0x01) {
                data[out_pos] |= 0x01 << out_col;
            }
        }
    } else if (row == 1) {                          /* Bulk erase instruction */
        move_to_id_state();
#ifdef EVAL
        printf("Device in idle state\n");
#endif
        port_bit = NUL;
        execute();                                  /* move the chain into shift
                                                     * state */
#ifdef EVAL
        printf("Device in shift state\n");
#endif
        shiftstate = true;
        if (data_length[row] > 0) {                 /* applicable only if
                                                     * programming */
            do_shift_instruction = true;
            if (erase_pulse > 0)
                do_erase = true;
        }
    } else {
        if (data_length[row] == 0)
            condition = 19;                         /* encounter do nothing row */
        else if (row == last_row)
            condition = 18;                         /* security fuse row */
        else
            condition = (row - 2) % 18;
        switch (condition) {
            case 0:                                 /* shift in address
                                                     * instruction */
                do_shift_instruction = true;
                break;
            case 1:                                 /* address bits */
                do_shift_in_data = true;
                allzero = false;
                break;
            case 2:                                 /* verify erased even rows of
                                                     * ED devices */
            case 10:                                /* verify erased odd rows of
                                                     * HD devices */
                do_shift_instruction = true;
                break;
            case 3:                                 /* shift out the erase bits of
                                                     * even rows */
            case 11:                                /* shift out the erase bits of
                                                     * odd rows */
                do_shift_instruction = true;
                /* start the verify timing */
                sclk_with_verify_delay();           /* to simmulte verify delay */
                port_bit = NUL;
                execute();                          /* stop the verify timing */
#ifdef EVAL
                printf("Device in shift state condition %d\n", condition);
#endif
                shiftstate = true;
                break;
            case 4:                                 /* shift out data to verify HD
                                                     * devices */
            case 12:                                /* shift out data to verify HD
                                                     * devices */
                if (program_pulse > 0)
                    for (i = 0; i < data_length[row]; i++) {
```

```c
                        /* read the first bit */
                sdo = (in_SDO & inp(inputport));
                if (sdo != in_SDO) {
                    error++;                    /* look for all 1s */
#ifdef EVAL
                    printf("error happen at row = %d  bit = %d\n", row, i);
#endif
                }
                sclock();                       /* clock out the next bit */
            }
            port_bit = NUL;
            execute();                          /* ready for other
                                                   operation */
#ifdef EVAL
            printf("Device in shift state condition %d\n", condition);
#endif
            shiftstate = true;
            break;
        case 5:                                 /* shift in data for
                                                 * programming */
        case 13:                                /* shift in data for
                                                 * programming */
            do_shift_instruction = true;
            break;
        case 6:                                 /* pack data for even row of
                                                 * HD devices */
        case 14:                                /* data for odd row of HD
                                                 * devices */
            do_shift_in_data = true;
            bit_1_count = 0;                    /* clear the counter for fuse
                                                 * bit 1s */
            allzero = false;
            break;
        case 7:                                 /* program command */
        case 15:
            do_shift_instruction = true;
            allzero = true;                     /* if the entire command is 0
                                                 * (NOP) then skip */
            if (program_pulse > 0)
                do_program = true;
            break;
        case 8:                                 /* verify command for all
                                                 * devices in the chain */
        case 16:
            do_shift_instruction = true;
            break;
        case 9:                                 /* shift out data to verify
                                                 * all devices in the chain */
        case 17:
            do_shift_instruction = true;
            do_shift_out_data = true;
            /* start the verify timing */
            sclk_with_verify_delay();           /* to simmulte verify delay */
            port_bit = NUL;
            execute();                          /* stop the verify timing */
#ifdef EVAL
            printf("Device in shift state condition %d\n", condition);
#endif
            shiftstate = true;
            break;
        case 18:                                /* take care of programming
                                                 * security fuses */
            do_shift_instruction = true;
            if (program_pulse > 0)
                do_program = true;
            break;
```

```
                case 19:                              /* do nothing row */
                   if ((((row - 2) % 18) == 5) || (((row - 2) % 18) == 13))
                      length = 0;                     /* the data string is empty */
                   if (!shiftstate) {                 /* move the chain to shift
                                                       * state next operation */
                      shiftstate = true;
                      port_bit = NUL;
                      execute();
#ifdef EVAL
                      printf("Device in shift state condition %d\n", condition);
#endif
                      length = 0;
                   }
                   break;
                default:                              /* take care of do nothing
                                                       row */
                   break;
             }
          }
          if ((do_shift_instruction) || (do_shift_in_data)) {
             /* check the purpose of the instruction */
             if (do_shift_in_data) {                  /* keep the data for later
                                                       * verification */
                out_pos = 0;
                out_col = 8;
                data[out_pos] = 0x00;
                length = data_length[row];
             }
             for (index = 0; index < data_length[row]; index++) {
                --in_col;
                if (do_shift_in_data) {
                   --out_col;
                   if (out_col < 0) {
                      out_col = 7;
                      out_pos++;
                      data[out_pos] = 0x00;
                   }
                }
                if (in_col < 0) {
                   in_col = 7;
                   n++;
                   if (n >= 0xFFF0) {
                      m++;
                      n = 0;
                   }
                   curch = buffer[m][n];
                }
                if ((curch >> in_col) & 0x01) {
                   allzero = false;                   /* a 1 exist */
                   if (port_bit & out_SDI) {
                   }
                   /* SDI is already a 1 */
                   else
                      outp(outputport, out_SDI);
                   outp(outputport, out_SDI + out_SCLK);
                   outp(outputport, out_SDI);
                   /* outp(outputport,NUL);  */
                   port_bit = out_SDI;                /* clock a 1 into sdi */
#ifdef EVAL
                   printf("1");
#endif
                   if (do_shift_in_data) {
                      data[out_pos] |= 0x01 << out_col;
                      bit_1_count++;                  /* count the bits of 1s
                                                       * shifted in */
```

```
                    }
            } else {
#ifdef EVAL
            printf("0");
#endif
            if (port_bit & out_SDI)            /* bring SDI to 0? */
                outp(outputport, NUL);
            outp(outputport, NUL + out_SCLK);
            outp(outputport, NUL);
            port_bit = NUL;
         }                                     /* clock a zero into sdi */

}
      if ((row == 1) && (erase_pulse == 0)) {  /* don't execute the BE
                                                 * command */
         do_erase = false;
      }
       /* if erase pulse is set to 0 */
      else if ((condition == 7) || (condition == 15)) {
         if (program_pulse == 0) {
            do_program = false;
         }
         /* ignore the program command */
          /* if program pulse is set to 0 */
         else if ((bit_1_count == length) && (bit_1_count > 0)) {
            do_program = false;
         }
         /* ignore the program command */
          /* if the whole row are 1s */
         else if (allzero) {                   /* the whole commands are
                                                  NOPs */
            do_program = false;
         }
          /* skip the command */
         else {
            shiftstate = false;                /* move chain to execute
                                                  state */
            port_bit = NUL;
            execute();
#ifdef EVAL
            printf("Device in execute state condition %d\n", condition);
endif }
      } else {
         port_bit = NUL;
         execute();                            /* execute the command */
#ifdef EVAL
         printf("Device in execute state condition %d\n", condition);
endif
         if (do_shift_instruction)
            shiftstate = false;                /* chain in execute state */
         else
            shiftstate = true;
      }
   }
   if ((do_erase) || (do_program)) {           /* program devices */
#ifdef EVAL
      printf("programming pulse width is %d\n", program_pulse);
#endif
      if (do_program)
         sclk_with_delay(program_pulse);
      else if (do_erase)
         sclk_with_delay(erase_pulse);
      port_bit = NUL;
      if (do_erase) {                          /* 500us delay min. after bulk
```

```
                                                        * erase */
                outp(outputport, NUL + out_MODE);
                outp(outputport, NUL + out_MODE + out_SDI);
                wait_for(1);                            /* 1ms delay from mode to
                                                         * clock */
                outp(outputport, NUL + out_MODE + out_SDI + out_SCLK);
                outp(outputport, NUL + out_MODE + out_SDI);
                outp(outputport, NUL + out_MODE);
                outp(outputport, NUL);
            } else if ((data_length[row] > 0) && (!shiftstate)) {
                execute();
#ifdef EVAL
                printf("Device in shift state condition %d\n", condition);
#endif
                shiftstate = true;              /* chain back in shift
                                                   state */
            }
            if (do_erase) {                     /* to reset the security cell
                                                 * of 22v10 */
                outp(outputport, NUL + out_MODE);    /* MOVE DEVICE TO ID STATE */
                outp(outputport, NUL + out_MODE + out_SCLK);
                outp(outputport, NUL + out_MODE);
                outp(outputport, NUL);
                port_bit = NUL;
#ifdef EVAL
                printf("Device in execute state condition %d\n", condition);
endif
                execute();                      /* back into isp mode */
#ifdef EVAL
                printf("Device in shift state\n");
#endif
                shiftstate = true;              /* chain in shift state */
            }
        } else if (do_shift_out_data) {         /* shift data out to verify */
           out_col = 8;
           out_pos = 0;
           for (i = 0; i < length; i++) {
              --out_col;
              if (out_col < 0) {
                 out_col = 7;
                 out_pos++;
              }
              if (cur_bit = ((data[out_pos] >> out_col) & 0x01))
                 cur_bit = in_SDO;              /* map to the SDO bit */
              sdo = (in_SDO & inp(inputport));  /* read the first bit */
              if (sdo != cur_bit) {
                 error++;
              }
              sclock();                         /* shift out the next bit */
           }                                    /* end of for */
           if ((data_length[row] > 0) && (!shiftstate)) {
              port_bit = NUL;
              execute();
#ifdef EVAL
                printf("Device in shift state condition %d\n", condition);
#endif
                shiftstate = true;              /* chain in shift state */
            }
        }                                       /* end of if */
        if (error > 0) {
            break;
#ifdef EVAL
            printf("failed at condition = %d  & bit = %d\n",
                condition, i);
#endif
```

```
        ]
    }                                               /* end of for */ free(data);
    move_to_id_state();

if (error > 0) {
#ifdef EVAL
        printf("failed at condition = %d & bit = %d & row = %d\n",
               condition, i, row);
#endif
        return (VALIDATION_ERROR);
    } else {
        /* set ISP and RESET high, so customer can see device working */
        /* activate the chain only if no port precondition */
        if (NUL == 0)
            outp(outputport, NUL + out_ISP + out_RESET);
    } return (OK);
}

/***************************************************************
 *                                                             *
 *                        error_handler                        *
 *                                                             *
 * rcode              - error code                             *
 *                                                             *
 *                                                             *
 * This procedure return the address of the message string    *
 * for the corresponding error code.                          *
 *                                                             *
 ***************************************************************/ void        error_handler(int rcode, char *message)
{
/*added by ht for error handling*/
    char *error_message[] = {{"PASS"}, {""}, {""}, {"PC Hardware Problem"},
        {"Chip and JEDEC File Doesn't Match"},
        {"Can't Find the Download Cable"}, {"The VCC on Board Is Not On"},
        {"No Device Found/Open Download Cable/Open Daisychain"},
        {"Can't Find the File"}, {"The File Is Not Complete"},
        {"Not Enough PC Memory"},
        {"Verification Fail"}, {"The Device is Secured"}, {"Non isp Part Found"},
        {"The File Contain Operation Not Supported in This Mode"},
        {"The Chip Count In the Chain and The File Do not Match"},
        {"Unknown Device Found"}, {"Wrong File Type"}, {"The File Has Error"},
        {"The File Has Invalid UES Character"}};

strcpy(message, error_message[-rcode]);
}
```

```
/****************************************************************
 *                                                              *
 *                      ISJEDEC                                 *
 *                                                              *
 * ch                   - current character to check            *
 *                                                              *
 *                                                              *
 * This procedure checks to see if ch is a valid jedec char.    *
 *                                                              *
 ****************************************************************/ int             isjedec(char ch)
{
   if ((isprint(ch)) || (isspace(ch)))
      return 1;
   else
      return 0;
}

/****************************************************************
 *                                                              *
 *                   FIND_BEG_JEDEC_FIELD                       *
 *                                                              *
 * ch                   - current character                     *
 * fpr                  - pointer to fuse file                  *
 *                                                              *
 *                                                              *
 * This procedure looks for the next valid jedec field char     *
 *                                                              *
 ****************************************************************/ char            find_beg_jedec_field(char *ch, FILE * fpr)
{
   *ch = fgetc(fpr);

while ((isjedec(*ch)) && (isspace(*ch)))
      *ch = fgetc(fpr);

if ((!isjedec(*ch)) && (*ch != jedec_etx))
      return FILE_NOT_JEDEC;
   else
      return OK;
}

/****************************************************************
 *                                                              *
 *                   FIND_END_JEDEC_FIELD                       *
 *                                                              *
 * ch                   - current character                     *
 * fpr                  - pointer to fuse file                  *
 *                                                              *
 * This procedure looks for the end of jedec field char (*)     *
 *                                                              *
 ****************************************************************/ char            find_end_jedec_field(char *ch, FILE * fpr)
{
   *ch = fgetc(fpr);

while ((*ch != '*') && (isjedec(*ch)))
      *ch = fgetc(fpr);
```

```
    if (!isjedec(*ch))
        return FILE_NOT_JEDEC;
    else
        return OK;
}

/****************************************************************
 *                                                              *
 *                    GET_JEDEC_L_FIELD                         *
 *                                                              *
 * fpr              - pointer to fuse file                      *
 * infile           - packed array to store jedec data          *
 * nfuse            - number of unique fuses specified          *
 *                                                              *
 *                                                              *
 * This procedure reads in the jedec data specified in an L     *
 * field. Nfuse is used to count the number of unique fuses     *
 * that have been specified                                     *
 *                                                              *
 ****************************************************************/
char        get_jedec_l_field(FILE * fpr, unsigned char *infile, unsigned long *nfuse)
{
    char          ch = '0';
    int           col;
    unsigned long j;
    unsigned long pos;
    unsigned long fusenum;
    unsigned char uch;

ch = '0';
    j = 0;

fscanf(fpr, "%lu", &fusenum);

if ((fusenum / 8) <= (unsigned long) filemax) {
        pos = fusenum / 8;
        col = 7 - (fusenum % 8) + 1;

uch = infile[pos];                      /* grab existing data since
                                                 * fuse may not be on byte
                                                 * boundary */ while ((ch != '*') && (isjedec(ch))) {
            ch = fgetc(fpr);
            if ((ch == '0') || (ch == '1')) {   /* found a fuse, so pack
                                                 * internally */
                ++j;
                --col;
                if (pos > filemax)
                    return FILE_TOO_BIG;

if (col < 0) {
                    infile[pos++] = uch;
                    uch = infile[pos];          /* grab the default fuse state */
                    col = 7;
                }
                /* count number of specified fuses */
                ++(*nfuse);

if (ch == '1')
                    uch |= (1 << col);          /* fill 1 */
                else
```

```
                    uch &= ~(1 << col);                /* fill 0 */
            } else if ((!isspace(ch)) && (ch != '*'))
                return FILE_NOT_JEDEC;
        } if (pos > filemax)
            return FILE_TOO_BIG;

if (j > 0) {
            array_changed = true;
            infile[pos] = uch;
        }
        if (ch != '*')
            return FILE_NOT_JEDEC;
    } else
        return FILE_NOT_JEDEC;

return OK;
}

/*added by ht to support UES*/
/***************************************************************
 *                                                              *
 *                      GET_JEDEC_U_FIELD                       *
 *                                                              *
 * fpr                  - pointer to fuse file                  *
 * infile               - packed array to store jedec data      *
 * nfuse                - number of unique fuses specified      *
 *                                                              *
 *                                                              *
 * This procedure reads in the jedec data specified in an L     *
 * field. Nfuse is used to count the number of unique fuses     *
 * that have been specified                                     *
 *                                                              *
 ***************************************************************/ char        get_jedec_u_field(FILE * fpr, unsigned char *infile, unsigned long *nfuse)
{
    char            ch;
    int             col,
                    rcode,
                    j;
    unsigned long   pos;
    unsigned char   uch,
                    curch;

ch = getc(fpr);
    j = 0;
    pos = *nfuse / 8;
    col = 7 - (*nfuse % 8) + 1;
    uch = infile[pos];
    rcode = OK;
    switch (ch) {
        case '\n':
        case ' ':
            ch = getc(fpr);                      /* skip blanks */
        case '0':
        case '1':
            while ((ch != '*') && (isjedec(ch))) {
                if ((ch == '0') || (ch == '1')) {    /* found a fuse, so pack
                                                      * internally */
                    --col;
                    if (pos > filemax)
                        return FILE_TOO_BIG;
                    if (col < 0) {
```

```
                    infile[pos++] = uch;
                    uch = infile[pos];
                    col = 7;
                 }
                 if (ch == '1')
                    uch |= (1 << col);
                 else
                    uch &= ~(1 << col);        /* fill 0 */
              } else if ((!isspace(ch)) && (ch != '*'))
                 return FILE_NOT_JEDEC;
              ch = getc(fpr);
           }
           /* Take care of the last byte */
           infile[pos] = infile[pos] & (~(0xFF << col));  /* keep the non UES bits */
           infile[pos] |= uch;                 /* pack in the UES and non UES
                                                * bits */
           break;
       case 'H':
           ch = getc(fpr);
           if (ch == ' ')
              ch = getc(fpr);                  /* eat the 1st blank */
           while ((ch != '*') && (isjedec(ch))) {
              if (isxdigit(ch)) {
                 curch = ctoi(ch);
                 for (j = 0; j < 4; j++) {
                    --col;
                    if (col < 0) {
                       infile[pos++] = uch;
                       uch = infile[pos];
                       col = 7;
                    }
                    if ((curch >> (3 - j)) & 0x01)
                       uch |= (1 << col);
                    else
                       uch &= ~(1 << col);     /* fill 0 */
                 }
              } else if ((!isspace(ch)) && (ch != '*'))
                 return FILE_NOT_JEDEC;
              ch = getc(fpr);
           }
           /* Take care of the last byte */
           infile[pos] = infile[pos] & (~(0xFF << col));  /* keep the non UES bits */
           infile[pos] |= uch;                 /* pack in the UES and non UES
                                                * bits */
           break;

case 'A':
           ch = getc(fpr);
           while ((ch != '*') && (isjedec(ch))) {
              if ((ch == ' ') || (!(isspace(ch)))) {
                 for (j = 0; j < 8; j++) {
                    --col;
                    if (col < 0) {
                       infile[pos++] = uch;
                       uch = infile[pos];
                       col = 7;
                    }
                    if ((ch >> (7 - j)) & 0x01)
                       uch |= (1 << col);
                    else
                       uch &= ~(1 << col);     /* fill 0 */
                    if (pos > filemax)
                       return FILE_TOO_BIG;
                 }
              } else if ((!isspace(ch)) && (ch != '*'))
```

```
                return FILE_NOT_JEDEC;
            ch = getc(fpr);
        }
        /* Take care of the last byte */
        infile[pos] = infile[pos] & (0xFF - (0xFF << col));   /* keep the non UES bits */
        infile[pos] |= uch;                       /* pack in the UES and non UES
                                                   * bits */
        break;
    default:
        rcode = find_end_jedec_field(&ch, fpr);
        break;
    }
    if (ch != '*')
        return FILE_NOT_JEDEC;

return rcode;
}

/**************************************************************
 *                                                            *
 *                  READ_MEMORY_CHECKSUM                      *
 *                                                            *
 * infile            - packed array to store jedec data       *
 * fchecksum         - fuse checksum in JEDEC file            *
 * nfuse             - number of fuses packed                 *
 *                                                            *
 * This procedure calculate the checksum of the data packed   *
 * in the array.                                              *
 *                                                            *
 * By Howard Tang                                             *
 **************************************************************/
int         read_memory_checksum(unsigned char *infile, unsigned long fchecksum, unsigned
{
    unsigned long   checksum;
    unsigned long   i,
                    pos;
    int             rcode,
                    col,
                    k;
    unsigned char   uch,
                    temp;

rcode = OK;
    checksum = 0x00000000;
    pos = nfuse / 8;
    col = 8 - nfuse % 8;
    for (i = 0; i < pos; ++i) {
        uch = 0;
        for (k = 0; k < 8; k++)
            if (infile[i] & (1 << k))
                uch |= 1 << (7 - k);
        checksum += (unsigned long) uch;
    }
    temp = infile[i] & (0xFF << col);
    uch = 0;
    for (k = 0; k < 8; k++)
        if (temp & (1 << k))
            uch |= 1 << (7 - k);
    checksum += (unsigned long) uch;
    checksum = checksum & 0xFFFF;
    if (fchecksum != checksum)
        rcode = FILE_NOT_VALID;
```

```
    return rcode;
}

/***************************************************************
*                                                              *
*                     READ_JEDEC_FILE                          *
*                                                              *
* fpr                - pointer to fuse file                    *
* infile             - packed array to store jedec data        *
* nfuse              - number of fuses read                    *
*                                                              *
*                                                              *
* This procedure reads in data from a true jedec formatted     *
* file and packs the data into the array infile.               *
*                                                              *
***************************************************************/ int            read_jedec_file(FILE * fpr, unsigned char *infile, unsigned long *nfuse)
{
    char           ch;
    int            found_l_field,
                   found_f_field;
    int            fstate;
    unsigned long  i,
                   qf,
                   pos;
    unsigned char  fstatech;
    char           found_etx;
    int            rcode,
                   col;
    int            j,
                   k;
    unsigned long  fchecksum;              /* Added by ht for fuse
                                            * checksum comparison */ fchecksum = 0;
    found_l_field = false;
    found_f_field = false;
    found_etx = false;
    fstatech = 0x00;                       /* Added by ht to set default
                                            * to 0s */
    qp = 0;
    ch = '0';
    qf = 0;
    *nfuse = 0;
    rcode = OK;
/* ht ???*/
    write_ues_row = 0;

for (i = 0; i < filemax; i++) {
        infile[i] = fstatech;
    } rcode = find_end_jedec_field(&ch, fpr);     /* skip jedec header */ while ((isjedec(ch)) && (!found_etx) && (rcode == OK)) {
        rcode = find_beg_jedec_field(&ch, fpr);

if (rcode == OK) {
            ch = toupper(ch);

if (isjedec(ch)) {
                switch (ch) {
                    case 'L':
```

```
            rcode = get_jedec_l_field(fpr, infile, nfuse);   /* link field       */
            found_l_field = true;
            break;
         case 'Q':
            ch = fgetc(fpr);                /* value field      */
            ch = toupper(ch);
            switch (ch) {
               case 'F':
                  fscanf(fpr, "%lu", &qf); /* # fuses in file  */
                  if ((!found_l_field) && (found_f_field)) {
                     for (i = 0; i < filemax; ++i) {
                        infile[i] = fstatech;
                     }
                  } else
                     rcode = FILE_NOT_JEDEC;
                  break;
               case 'P':
                  fscanf(fpr, "%d", &qp);  /* # pins on device */
                  break;
               case 'V':                    /* # test vectors   */ .
                  break;
               default:                     /* unknown value field */
                  break;
            }
            rcode = find_end_jedec_field(&ch, fpr);
            break;
         case 'F':
            fscanf(fpr, "%d", &fstate);
            if (fstate)
               fstatech = '\xFF';
            else
               fstatech = '\x00';

found_f_field = true;

if ((!found_l_field) && (qf > 0)) {   /* set default fuse
                                                   * state */
               array_changed = true;

for (i = 0; i < filemax; ++i) {
                  infile[i] = fstatech;
               }
            }
/*
                          else
                             rcode = FILE_NOT_JEDEC;
*/
            if (rcode == OK)
               rcode = find_end_jedec_field(&ch, fpr);
            break;
         case 'G':
            fscanf(fpr, "%d", &file_sfuse);
            rcode = find_end_jedec_field(&ch, fpr);
            break;

case 'C':
            fscanf(fpr, "%lx", &fchecksum);/* Modified by ht to handle
                                             * fuse checksum */
            rcode = find_end_jedec_field(&ch, fpr);
            break;

case 'N':
         case 'X':
         case 'V':
         case 'P':
```

```c
                    case 'D':
                    case 'R':
                    case 'S':
                    case 'T':
                    case 'E':
                        rcode = find_end_jedec_field(&ch, fpr);
                        break;
                    /* Added by ht to support UES */
                    case 'U':
                        pos = qf / 8;                     /* take care of the 1st ues
                                                           * bits */
                        col = qf % 8;
                        infile[pos++] = infile[pos] | (0xFF >> col);   /* fill the 1st UES bits
                                                                        * with 1s */
                        for (i = pos; i < filemax; ++i) {
                            infile[i] = '\xFF';           /* default UES to 1s due 3256
                                                           * has phantom cells */
                        }
                        rcode = get_jedec_u_field(fpr, infile, &qf);   /* ues field */
                        if (rcode == OK) {
                            write_ues_row = true;         /* UES field          */
                            *nfuse = qf;
                        } else
                            return FILE_NOT_VALID;
                        if (!found_l_field)
                            return FILE_NOT_VALID;        /* File has UES only, not
                                                           * valid for Programming */
                        break;
                    default:
                        rcode = find_end_jedec_field(&ch, fpr);
                        break;
                }
            } else if (ch == jedec_etx) {
                found_etx = true;
            } else if (ch != EOF) {
            }
        }
    } if (rcode == OK) {
        if (!found_etx) {
            if (ch != EOF)
                rcode = FILE_NOT_JEDEC;
            else
                rcode = FILE_NOT_JEDEC;
        } else {
            if ((!found_l_field) && (!found_f_field))
                rcode = FILE_NOT_JEDEC;
            else {
                if (found_f_field)
                    *nfuse = qf;
            }
        }
    }
    /* Added by ht to handle fuse checksum */
/*  if ((rcode == OK) && (qf > 0))
    {
     rcode = read_memory_checksum(infile,fchecksum, cf);
    }
*/
    fclose(fpr);

return rcode;
}
```

```c
/****************************************************************
 *                                                              *
 *                    GET_JEDEC_FILE                            *
 *                                                              *
 * name              - data file name                           *
 * fpr               - pointer to data file                     *
 * infile            - packed array to store jedec data         *
 * display           - display data on screen                   *
 *                                                              *
 *                                                              *
 * This procedure reads in data from a file containing jedec    *
 * data.  Only the engineering version can read multiple        *
 * formats (i.e. true jedec, engineering, stripped jedec...)    *
 * The procedure then determines the target device of the       *
 * fuse file read in.                                           *
 *                                                              *
 ****************************************************************/
int           get_jedec_file(char *infilename, FILE * fpr, unsigned char *infile, int displa
{
   int            i,
                  rcode,
                  done;
   unsigned long  nfuse,
                  dfuse;
   char           ch;

done = 0;
   rcode = OK;

if (!stricmp(infilename, file_name)) {
      fclose(fpr);

if (file_ok) {
         if (file_id != UNKNOWN) {
            rcode = OK;
            done = 1;
         } else {
            rcode = FILE_NOT_JEDEC;
         }
      } else {
         file_id = UNKNOWN;
         rcode = FILE_NOT_JEDEC;
      }
   }
   if ((rcode == OK) && (!done)) {
      nfuse = 0;
      ch = fgetc(fpr);
      file_sfuse = UNKNOWN;
      array_changed = false;
/*added by ht to support UES*/
      write_ues_row = 0;

while ((isjedec(ch)) && (ch != jedec_stx))
         ch = fgetc(fpr);

if (ch == jedec_stx) {                    /* standard jedec file format */
         rcode = read_jedec_file(fpr, infile, &nfuse);
      } else {
         rcode = FILE_NOT_JEDEC;
         invalid_jedec_file(infilename, display);
      }
```

```
        file_id = UNKNOWN;
/* Removed by ht to support UES*/
/*      write_ues_row = false;
 */
      if (rcode == OK) {
         file_ok = true;

i = 0;

do {
            if (nfuse == (unsigned long) device_info[i].jedec_bits)
               file_id = i;
            else {
               if (device_info[i].id == id_GAL22v10) {   /* see if ues bits
                                                          * specified */
                  if (nfuse == (device_info[i].jedec_bits + device_info[i].ues_bits)) {
                     file_id = i;
                     write_ues_row = true;
                  } else
                     ++i;
               } else
                  ++i;
            }
         }
         while ((i < max_devices) && (file_id == UNKNOWN));

if (file_id == UNKNOWN)
            rcode = FILE_NOT_VALID;
      } else {
         if (array_changed) {
            file_ok = false;
            file_sfuse = UNKNOWN;
         }
      }
   }
   return rcode;
}
```

```
/****************************************************************
 *                                                              *
 *                    SHIFT/EXECUTE                             *
 *                                                              *
 ****************************************************************/
void          execute()
{
   outp(outputport, out_MODE);
   outp(outputport, out_MODE + out_SDI);
   outp(outputport, out_MODE + out_SDI + out_SCLK);
   outp(outputport, out_MODE + out_SDI);
   outp(outputport, out_MODE);
   outp(outputport, NUL);

}

/****************************************************************
 *                                                              *
 *                    MOVE TO ID STATE                          *
 *                                                              *
 ****************************************************************/
void          move_to_id_state()
{
   outp(outputport, out_MODE);                   /* MOVE DEVICE TO ID STATE */
   pulse_width(10);                              /* allow 10 mS delay for 1st
                                                  * clock */
   outp(outputport, out_MODE + out_SCLK);
   outp(outputport, out_MODE);
   outp(outputport, NUL);
}
```

I claim:

1. A method for programming multiple field programmable devices, comprising the steps of:

connecting said field programmable devices serially in a chain configuration;

constructing a data stream file which represents a composite data stream for programming said field programmable devices;

retrieving, from a plurality of program data files, an individual programming data stream for each of said field programmable devices;

filling said data stream file with said individual programming data streams to form said composite data stream;

retrieving from said data stream file said composite data stream;

serially shifting said composite data stream into said field programmable devices; and programming said field programmable devices using said composite data stream.

2. A method as in claim 1, wherein said composite data stream shifts instructions sequentially into said field programmable devices, shifts programming data into said field programmable devices sequentially, causes said instructions to be executed simultaneously, and causes data to be shifted out of said field programmable devices sequentially.

3. A method as in claim 1, wherein said individual programming data stream comprising programming instructions and programming data, and wherein said step of retrieving an individual programming data stream comprises the steps of:

organizing said retrieved programming data as rows, each row corresponding to data associated with an address unit of the field programmable corresponding to said individual data stream; and rearranging said programming data such that rows having a predetermined data pattern are placed behind rows not having said predetermined data pattern.

4. A method as in claim 3, wherein said predetermined data pattern corresponds to a default data pattern of said field programmable device when unprogrammed.

5. A method as in claim 1, wherein one of said field programmable devices comprises a serial input pin, a serial output pin, a clock pin, and a mode pin.

6. A method as in claim 1, wherein one of said field programmable devices is a programmable device which comprises a programming enable pin, a serial input pin, a serial output pin, a clock pin, and a mode pin.

7. A method as in claim 1, wherein said field programmable devices comprises first and second field programmable devices, said first and second field programmable devices having, respectively, first and second gate arrays of unequal sizes.

8. A method as in claim 1, wherein said field programmable devices comprises first and second field programmable devices, said first and second field programmable devices having, respectively, first and second gate arrays of equal sizes.

9. A method as in claim 1, wherein said field programmable devices comprises first and second field programmable devices, said first and second field programmable devices having dissimilar addressing schemes.

10. A method as in claim 1, wherein said field programmable devices comprises first and second field programmable devices, said first and second field programmable devices having the same addressing scheme.

* * * * *